US007372145B2

(12) United States Patent
Silverbrook

(10) Patent No.: US 7,372,145 B2
(45) Date of Patent: May 13, 2008

(54) BONDED ASSEMBLY HAVING IMPROVED ADHESIVE BOND STRENGTH

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 320 days.

(21) Appl. No.: 11/066,159

(22) Filed: Feb. 28, 2005

(65) Prior Publication Data

US 2006/0192259 A1 Aug. 31, 2006

(51) Int. Cl.
*H01L 23/053* (2006.01)
*B41J 2/145* (2006.01)
*G11B 5/127* (2006.01)

(52) U.S. Cl. .......................... 257/701; 347/40; 347/47; 347/49; 347/59; 347/65; 216/27; 216/33

(58) Field of Classification Search ..................... None
See application file for complete search history.

(56) References Cited

U.S. PATENT DOCUMENTS

| | | | | |
|---|---|---|---|---|
| 4,929,969 | A * | 5/1990 | Morris | 347/87 |
| 6,127,243 | A | 10/2000 | Werner et al. | |
| 6,288,451 | B1 | 9/2001 | Tsao | |
| 6,406,636 | B1 | 6/2002 | Vaganov | |
| 6,410,859 | B1 | 6/2002 | King | |
| 6,433,390 | B1 | 8/2002 | Hara | |
| 6,435,667 | B1 * | 8/2002 | Silverbrook | 347/54 |
| 6,488,366 | B1 * | 12/2002 | Potochnik et al. | 347/65 |
| 2002/0021336 | A1 * | 2/2002 | Moon et al. | 347/65 |
| 2003/0116276 | A1 | 6/2003 | Weldon et al. | |
| 2003/0209314 | A1 | 11/2003 | Guo et al. | |
| 2003/0211705 | A1 * | 11/2003 | Tong et al. | 438/455 |
| 2004/0011761 | A1 | 1/2004 | Dewa | |
| 2004/0092804 | A1 | 5/2004 | Rayssac | |
| 2004/0113280 | A1 * | 6/2004 | Kim | 257/777 |
| 2004/0224480 | A1 * | 11/2004 | Forbes | 438/455 |
| 2004/0239729 | A1 * | 12/2004 | Kim et al. | 347/63 |
| 2005/0029222 | A1 | 2/2005 | Chen | |
| 2005/0100727 | A1 * | 5/2005 | Yokouchi et al. | 428/317.1 |
| 2005/0140731 | A1 * | 6/2005 | Silverbrook et al. | 347/49 |
| 2005/0157107 | A1 * | 7/2005 | Silverbrook et al. | 347/85 |
| 2005/0162462 | A1 * | 7/2005 | Silverbrook et al. | 347/40 |
| 2006/0192810 | A1 * | 8/2006 | Silverbrook | 347/40 |

* cited by examiner

*Primary Examiner*—Alonzo Chambliss

(57) ABSTRACT

A bonded assembly is provided. The bonded assembly comprises: (a) a first substrate having a plurality of etched trenches defined in a first bonding surface; and (b) a second substrate having a second bonding surface. The second bonding surface is bonded to the first bonding surface with an adhesive and the adhesive is received, at least partially, in the plurality of etched trenches. Semiconductors chips bonded to a second substrate exemplify the advantages of the invention. The etched trenches allow the adhesive bond to be strengthened whilst avoiding increased surface roughening.

16 Claims, 26 Drawing Sheets

BONDED ASSEMBLY HAVING IMPROVED ADHESIVE BOND STRENGTH

FIELD OF THE INVENTION

This invention relates to a method of bonding substrates together, and a substrate adapted therefore. It has been developed primarily for maximizing bonding of microscale substrates to other substrates, whilst avoiding traditional surface abrasion techniques.

CO-PENDING APPLICATIONS

The following applications have been filed by the Applicant simultaneously with the present application:

| | | | |
|---|---|---|---|
| 11/066161 | 11/066160 | 11/066158 | 11/066165 |

The disclosures of these co-pending applications are incorporated herein by reference.

CROSS REFERENCES TO RELATED APPLICATIONS

The following patents or patent applications filed by the applicant or assignee of the present invention are hereby incorporated by cross-reference.

| | | | | | |
|---|---|---|---|---|---|
| 11/003786 | 11/003616 | 11/003418 | 11/003334 | 11/003600 | 11/003404 |
| 11/003419 | 11/003700 | 11/003601 | 11/003618 | 11/003615 | 11/003337 |
| 11/003698 | 11/003420 | 6984017 | 11/003699 | 11/003463 | 11/003701 |
| 11/003683 | 11/003614 | 11/003702 | 11/003684 | 11/003619 | 11/003617 |
| 6623101 | 6406129 | 6505916 | 6457809 | 6550895 | 6457812 |
| 7152962 | 6428133 | 10/815625 | 10/815624 | 10/815628 | 10/913375 |
| 10/913373 | 10/913374 | 10/913372 | 7138391 | 7153956 | 10/913380 |
| 10/913379 | 10/913376 | 7122076 | 7148345 | 10/407212 | 10/407207 |
| 10/683064 | 10/683041 | 10/882774 | 10/884889 | 10/922890 | 10/922875 |
| 10/922885 | 10/922889 | 10/922884 | 10/922879 | 10/922887 | 10/922888 |
| 10/922874 | 10/922873 | 10/922871 | 10/922880 | 10/922881 | 10/922882 |
| 10/922883 | 10/922878 | 10/922872 | 10/922876 | 10/922886 | 10/922877 |
| 6746105 | 7156508 | 7159972 | 7083271 | 7165834 | 7080894 |
| 10/760218 | 7090336 | 7156489 | 10/760233 | 10/760246 | 7083257 |
| 10/760243 | 10/760201 | 10/760185 | 10/760253 | 10/760255 | 10/760209 |
| 7118192 | 10/760194 | 10/760238 | 7077505 | 10/760235 | 7077504 |
| 10/760189 | 10/760262 | 10/760232 | 10/760231 | 7152959 | 10/760190 |
| 7178901 | 10/760227 | 7108353 | 7104629 | 10/728804 | 7128400 |
| 7108355 | 6991322 | 10/728790 | 7118197 | 10/728970 | 10/728784 |
| 10/728783 | 7077493 | 6962402 | 10/728803 | 7147308 | 10/728779 |
| 7118198 | 7168790 | 7172270 | 10/773199 | 6830318 | 10/773201 |
| 7175261 | 10/773183 | 7108356 | 7118202 | 10/773186 | 7134744 |
| 10/773185 | 7134743 | 7182439 | 10/773203 | 10/773187 | 7134745 |
| 7156484 | 7118201 | 7111926 | 10/773184 | 09/575197 | 7079712 |
| 09/575123 | 6825945 | 09/575165 | 6813039 | 6987506 | 7038797 |
| 6980318 | 6816274 | 7102772 | 09/575186 | 6681045 | 6728000 |
| 7173722 | 7088459 | 09/575181 | 7068382 | 7062651 | 6789194 |
| 6789191 | 6644642 | 6502614 | 6622999 | 6669385 | 6549935 |
| 6987573 | 6727996 | 6591884 | 6439706 | 6760119 | 09/575198 |
| 7064851 | 6826547 | 6290349 | 6428155 | 6785016 | 6831682 |
| 6741871 | 6927871 | 6980306 | 6965439 | 6840606 | 7036918 |
| 6977746 | 6970264 | 7068389 | 7093991 | 7190491 | 10/884885 |
| 10/884883 | 10/901154 | 10/932044 | 10/962412 | 7177054 | 10/962552 |
| 10/965733 | 10/965933 | 10/974742 | 10/986375 | 6982798 | 6870966 |
| 6822639 | 6737591 | 7055739 | 09/575129 | 6830196 | 6832717 |
| 6957768 | 7170499 | 7106888 | 7123239 | 10/727181 | 10/727162 |
| 10/727163 | 10/727245 | 7121639 | 7165824 | 7152942 | 10/727157 |
| 7181572 | 7096137 | 10/727257 | 10/727238 | 7188282 | 10/727159 |
| 10/727180 | 10/727179 | 10/727192 | 10/727274 | 10/727164 | 10/727161 |
| 10/727198 | 10/727158 | 10/754536 | 10/754938 | 10/727227 | 10/727160 |
| 10/934720 | 10/296522 | 6795215 | 7070098 | 7154638 | 6805419 |
| 6859289 | 6977751 | 6398332 | 6394573 | 6622923 | 6747760 |
| 6921144 | 10/884881 | 7092112 | 10/949294 | 10/854521 | 10/854522 |

-continued

| | | | | | |
|---|---|---|---|---|---|
| 10/854488 | 10/854487 | 10/854503 | 10/854504 | 10/854509 | 7188928 |
| 7093989 | 10/854497 | 10/854495 | 10/854498 | 10/854511 | 10/854512 |
| 10/854525 | 10/854526 | 10/854516 | 10/854508 | 10/854507 | 10/854515 |
| 10/854506 | 10/854505 | 10/854493 | 10/854494 | 10/854489 | 10/854490 |
| 10/854492 | 10/854491 | 10/854528 | 10/854523 | 10/854527 | 10/854524 |
| 10/854520 | 10/854514 | 10/854519 | 10/854513 | 10/854499 | 10/854501 |
| 10/854500 | 10/854502 | 10/854518 | 10/854517 | 10/934628 | 10/760254 |
| 10/760210 | 10/760202 | 10/760197 | 10/760198 | 10/760249 | 10/760263 |
| 10/760196 | 10/760247 | 7156511 | 10/760264 | 10/760244 | 7097291 |
| 10/760222 | 10/760248 | 7083273 | 10/760192 | 10/760203 | 10/760204 |
| 10/760205 | 10/760206 | 10/760267 | 10/760270 | 10/760259 | 10/760271 |
| 10/760275 | 10/760274 | 7121655 | 10/760184 | 10/760195 | 10/760186 |
| 10/760261 | 7083272 | 11/014764 | 11/014763 | 11/014748 | 11/014747 |
| 11/014761 | 11/014760 | 11/014757 | 11/014714 | 11/014713 | 11/014762 |
| 11/014724 | 11/014723 | 11/014756 | 11/014736 | 11/014759 | 11/014758 |
| 11/014725 | 11/014739 | 11/014738 | 11/014737 | 11/014726 | 11/014745 |
| 11/014712 | 11/014715 | 11/014751 | 11/014735 | 11/014734 | 11/014719 |
| 11/014750 | 11/014749 | 11/014746 | 11/014769 | 11/014729 | 11/014743 |
| 11/014733 | 11/014754 | 11/014755 | 11/014765 | 11/014766 | 11/014740 |
| 11/014720 | 11/014753 | 11/014752 | 11/014744 | 11/014741 | 11/014768 |
| 11/014767 | 11/014718 | 11/014717 | 11/014716 | 11/014732 | 11/014742 |

Some applications have been listed by docket numbers. These will be replaced when application numbers are known.

BACKGROUND OF THE INVENTION

It is well known that surfaces bond better using liquid adhesives if the surfaces are first roughened. Surface roughening increases the surface area available for bonding to the liquid adhesive, which significantly increases the adhesive bond strength.

Typically, surface roughening is achieved by abrading either or both of the surfaces to be bonded. For example, simply abrading one of the surfaces with emery cloth can achieve significant improvements in adhesive strength when compared with non-abraded surfaces.

However, when bonding microscale substrates, such as semiconductor integrated circuits ("chips"), it is generally not desirable to abrade a surface of the substrate. Indeed, it is highly desirable for semiconductor chips to have very smooth surfaces. Any defects on the surface of the integrated circuit can result in crack propagation and significantly weaken the device. With a drive towards thinner and thinner integrated circuits (e.g. less than 200 micron ICs), there is a corresponding need to reduce surface roughness, in order to maintain acceptable mechanical strength in devices.

With surface roughness being of primary importance, silicon wafers are typically thinned using a two-step process. After front-end processing of the wafer, the wafer is usually first thinned by backgrinding in a mechanical grinding tool. Examples of wafer grinding tools are the Strasbaugh 7AF and Disco DFG-841 tools. Mechanical grinding is a quick and inexpensive method of grinding silicon. However, it also leaves a back surface having a relatively high surface roughness (e.g. $R_{max}$ of about 150 nm). Moreover, mechanical grinding can result in defects (e.g. cracks or dislocations), which extend up to about 20 μm into the back surface of the wafer.

In terms of mechanical strength, surface roughness and surface defects are unacceptable in integrated circuits. Accordingly, back-end thinning is typically completed by a technique, which removes these defects and provides a low surface roughness. Plasma thinning is one method used for completing wafer thinning. Typically, plasma thinning is used to remove a final 20 μm of silicon to achieve a desired wafer thickness. Whilst plasma thinning is relatively slow, it results in an extremely smooth back surface with virtually no surface defects. Typically, plasma thinning provides a maximum surface roughness ($R_{max}$) of less than 1 nm. Hence, plasma thinning is a method of choice for back-end processing in integrated circuit fabrication Integrated circuits, such as MEMS devices, often need to be bonded to other substrates. In the fabrication of the Applicant's MEMS printheads, for example, printhead integrated circuits bonded side-by-side onto a moulded ink manifold to form a printhead assembly. (For a detailed description of the Applicant's printhead fabrication process, see the Detailed Description below and U.S. patent application Ser. No. 10/728,970, the contents of which is incorporated herein by cross-reference).

However, it will be appreciated that integrated circuits have contradictory requirements of their backside surfaces. On the one hand, the backside surfaces of integrated circuits should have a low surface roughness and be devoid of any cracks, in order to maximize their mechanical strength. This is especially important for thin (e.g. less than 250 μm integrated circuits). On the other hand, the backside surfaces of integrated circuits often need to be suitable for bonding to other substrates using adhesives or adhesive tape. As discussed above, adhesive strength is usually maximized by increasing the surface roughness of a surface to be bonded, thereby maximizing contact with the intermediate adhesive.

It would be desirable to provide an improved method of bonding substrates using adhesives, which avoids increasing the surface roughness of the substrate. It would also be desirable to provide a thin substrate (e.g. <1000 micron thick substrate), which has a surface suitable for bonding using adhesives, but maintains acceptable mechanical strength.

SUMMARY OF THE INVENTION

In a first aspect, there is provided a method of bonding a first substrate to a second substrate, the method comprising the steps of:

(a) providing a first substrate having a plurality of etched trenches defined in a first bonding surface;

(b) providing a second substrate having a second bonding surface; and (c) bonding the first bonding surface and the second bonding surface together using an adhesive, wherein the adhesive is received, at least partially, in the plurality of etched trenches during bonding.

In a second aspect, there is provided a first substrate suitable for bonding to a second substrate using an adhesive, said first substrate having a plurality of etched trenches defined in a first bonding surface, the etched trenches being configured for receiving the adhesive during bonding.

In a third aspect, there is provided a bonded assembly comprising:

(a) a first substrate having a plurality of etched trenches defined in a first bonding surface;

(b) a second substrate having a second bonding surface; and (c) an adhesive bonding the first bonding surface and the second bonding surface together, wherein the adhesive is sandwiched between the first and second substrates, and is received in the plurality of etched trenches.

In a fourth aspect, there is provided a printhead assembly comprising:

(a) a plurality of printhead integrated circuits, each printhead integrated circuit comprising:

a plurality of nozzles formed on a frontside of the printhead integrated circuit;

a plurality of ink supply channels for supplying ink from a backside of the printhead integrated circuit to the nozzles; and a plurality of etched trenches defined in the backside; and (b) an ink manifold having a mounting surface, the backside of each printhead integrated circuit being bonded to the mounting surface with an adhesive, wherein the adhesive is received, at least partially, in the plurality of etched trenches.

In a fifth aspect, there is provided a printhead integrated circuit suitable for bonding to a mounting surface of an ink manifold using an adhesive, said printhead integrated circuit comprising:

a plurality of nozzles formed on a frontside of the printhead integrated circuit;

a plurality of ink supply channels for supplying ink from a backside of the printhead integrated circuit to the nozzles; and a plurality of etched trenches defined in the backside, the etched trenches being configured for receiving the adhesive during bonding.

Hitherto, surface roughening was the only method used for improving the surface characteristics of substrates to be bonded. However, as explained above, surface roughening is undesirable in very thin substrates, such as silicon chips, having a thickness of less than 1000 μm, optionally less than 500 μm or optionally less than 250 μm. Hence, the present invention provides a method of improving adhesive-bonding in a controlled manner, which is especially suitable for use in bonding silicon chips (e.g. MEMS chips) to other substrates. However, the invention is not limited for use with semiconductor chips and may be used for bonding any etchable substrate (e.g. metal substrates, silicon oxide substrates, silicon nitride substrates etc.) where surface roughening is undesirable.

The invention is particularly advantageous for use in fabrication of printhead chips, because printhead chips typically have ink supply channels etched into a backside bonding surface. Therefore, the trenches of the present invention may be etched at the same time as the ink supply channels, without requiring any additional steps in the fabrication process.

The nature of the second substrate is not particularly limited and may be comprised of, for example, plastics, metal, silicon, glass etc. The second substrate may, optionally, comprise the trenches described above in connection with the first substrate.

The trenches may be dimensioned to draw in adhesive by a capillary action. The exact dimensions required will depend on the surface tension of the adhesive. The required trench dimensions can be readily determined by the person skilled in the art using well known equations of capillarity. Alternatively, the trenches may be dimensioned to simply receive adhesive when the second substrate, and the adhesive, are pressed against the first bonding surface. Typically, the trenches have a diameter (in the case of cylindrical trenches) or a width (in the case of non-cylindrical trenches) of less than about 10 μm, optionally less than about 5 μm or optionally less than about 3 μm.

The trenches may have any depth suitable for improving adhesion without compromising the overall robustness of the first substrate. Optionally, the trenches are etched to depth of at least 10 μm, optionally at least 20 μm, optionally at least 30 μm, or optionally at least 50 μm. Typically, the trenches have an aspect ratio of at least 3:1, at least 5:1 or at least 10:1. High aspect ratio trenches may be readily etched by any known anisotropic etching technique (e.g. the Bosch process described in U.S. Pat. No. 5,501,893). High aspect ratios are advantageous for maximizing the available surface area for the adhesive, without compromising on overall mechanical strength.

Typically, the first bonding surface has a maximum surface roughness ($R_{max}$) of less than 20 nm, optionally an $R_{max}$ of less than 5 nm, or optionally an $R_{max}$ of less than 1 nm. The present invention is particularly advantageous when used with such surfaces, because these surfaces are usually poorly bonded using adhesives due to their exceptional smoothness. Alternatively, the first bonding surface may have an average surface roughness ($R_a$) of less than 20 nm, optionally an $R_a$ of less than 5 nm, or optionally an $R_a$ of less than 1 nm.

The adhesive is typically a liquid-based adhesive, or an adhesive which becomes liquid when heated for bonding. Optionally, the adhesive is an adhesive tape comprising an adhesive on one or both sides. Double-sided adhesive films or tapes are well known in the semiconductor art.

Optionally, the first substrate cools during the bonding process. This is usually achieved by heating the first substrate (which may also melt the adhesive), and then allowing it to cool whilst bonding to the second substrate. An advantage of this option is that a partial vacuum is created in the trenches, above the adhesive, which helps to hold the substrates together during bonding.

In a further aspect there is provided method wherein the first is substrate suitable for bonding to a second substrate using an adhesive, said first substrate having a plurality of etched trenches defined in a first bonding surface, the etched trenches being configured for receiving the adhesive during bonding.

In another aspect there is provided a bonded assembly comprising:

(a) a first substrate having a plurality of etched trenches defined in a first bonding surface; and (b) a second substrate having a second bonding surface, the second bonding surface being bonded to the first bonding surface with an adhesive, wherein the adhesive is received, at least partially, in the plurality of etched trenches.

In another aspect there is provided a printhead assembly comprising:

(a) a plurality of printhead integrated circuits, each printhead integrated circuit comprising:

a plurality of nozzles formed on a frontside of the printhead integrated circuit;

a plurality of ink supply channels for supplying ink from a backside of the printhead integrated circuit to the nozzles; and a plurality of etched trenches defined in the backside; and (b) an ink manifold having a mounting surface, the backside of each printhead integrated circuit being bonded to the mounting surface with an adhesive, wherein the adhesive is received, at least partially, in the plurality of etched trenches.

In a further-aspect there is provided a printhead integrated circuit suitable for bonding to a mounting surface of an ink manifold using an adhesive, said printhead integrated circuit comprising:

a plurality of nozzles formed on a frontside of the printhead integrated circuit;

a plurality of ink supply channels for supplying ink from a backside of the printhead integrated circuit to the nozzles; and a plurality of etched trenches defined in the backside, the etched trenches being configured for receiving the adhesive during bonding.

In another aspect there is provided a method of bonding a first substrate to a second substrate, the method comprising the steps of:

(a) providing a first substrate having a plurality of etched trenches defined in a first bonding surface;

(b) providing a second substrate having a second bonding surface; and (c) bonding the first bonding surface and the second bonding surface together using an adhesive, wherein the adhesive is received, at least partially, in the plurality of etched trenches during bonding.

In another aspect there is provided a bonded assembly comprising:

(a) a first substrate having a plurality of etched trenches defined in a first-bonding surface;

(b) a second substrate having a second bonding surface, the second bonding surface being bonded to the first bonding surface with an adhesive, wherein the adhesive is received, at least partially, in the plurality of etched trenches.

In a further aspect there is provided a method of bonding a first substrate to a second substrate comprising the steps of:

(a) providing a first substrate having a plurality of etched trenches defined in a first bonding surface;

(b) providing a second substrate having a second bonding surface; and (c) bonding the first bonding surface and the second bonding surface together using an adhesive, wherein the adhesive is received, at least partially, in the plurality of etched trenches during bonding.

In another aspect there is provided a first substrate suitable for bonding to a second substrate using an adhesive, said first substrate having a plurality of etched trenches defined in a first bonding surface, the etched trenches being configured for receiving the adhesive during bonding.

In a further aspect there is provided a method of bonding a first substrate to a second substrate, the method comprising the steps of:

(a) providing a first substrate having a plurality of etched trenches defined in a first bonding surface;

(b) providing a second substrate having a second bonding surface; and (c) bonding the first bonding surface and the second bonding surface together using an adhesive, wherein the adhesive is received, at least partially, in the plurality of etched trenches during bonding.

In a further aspect there is provided a first substrate suitable for bonding to a second substrate using an adhesive, said first substrate having a plurality of etched trenches defined in a first bonding surface, the etched trenches being configured for receiving the adhesive during bonding.

In another aspect there is provided a bonded assembly comprising:

(a) a first substrate having a plurality of etched trenches defined in a first bonding surface; and (b) a second substrate having a second bonding surface, the second bonding surface being bonded to the first bonding surface with an adhesive, wherein the adhesive is received, at least partially, in the plurality of etched trenches.

In a further aspect there is provided a printhead integrated circuit suitable for bonding to a mounting surface of an ink manifold using an adhesive, said printhead integrated circuit comprising:

a plurality of nozzles formed on a frontside of the printhead integrated circuit;

a plurality of ink supply channels for supplying ink from a backside of the printhead integrated circuit to the nozzles; and a plurality of etched trenches defined in the backside, the etched trenches being configured for receiving the adhesive during bonding.

In further aspect there is provided a method of bonding a first substrate to a second substrate, the method comprising the steps of:

(a) providing a printhead integrated circuit according to claim 1;

(b) providing a second substrate having a second bonding surface; and (c) bonding the first bonding surface and the second bonding surface together using an adhesive, wherein the adhesive is received, at least partially, in the plurality of etched trenches during bonding.

In another aspect there is provided a first substrate suitable for bonding to a second substrate using an adhesive, said first substrate having a plurality of etched trenches defined in a first bonding surface, the etched trenches being configured for receiving the adhesive during bonding; and wherein the first substrate is a printhead integrated circuit according to claim 1.

In a further aspect there is provided a bonded assembly comprising:

(a) a printhead integrated circuit according to claim 1; and (b) a second substrate having a second bonding surface, the second bonding surface being bonded to the first bonding surface with an adhesive, wherein the adhesive is received, at least partially, in the plurality of etched trenches.

In another aspect there is provided a printhead assembly comprising:

(a) a plurality of printhead integrated circuits, each printhead integrated circuit comprising:

a plurality of nozzles formed on a frontside of the printhead integrated circuit;

a plurality of ink supply channels for supplying ink from a backside of the printhead integrated circuit to the nozzles; and a plurality of etched trenches defined in the backside and each printhead integrated circuit being in accordance with claim 1; and (b) an ink manifold having a mounting surface, the backside of each printhead integrated circuit being bonded to the mounting surface with an adhesive, wherein the adhesive is received, at least partially, in the plurality of etched trenches.

DETAILED DESCRIPTION OF A SPECIFIC EMBODIMENT

A specific form of the invention is described below in the context of fabricating a printhead assembly for an inkjet printer. However, it will be appreciated that the invention may be used in connection with bonding any two substrates together and is not in any way limited to the specific embodiment of printhead fabrication.

Inkjet Printer Unit

Figure 1:
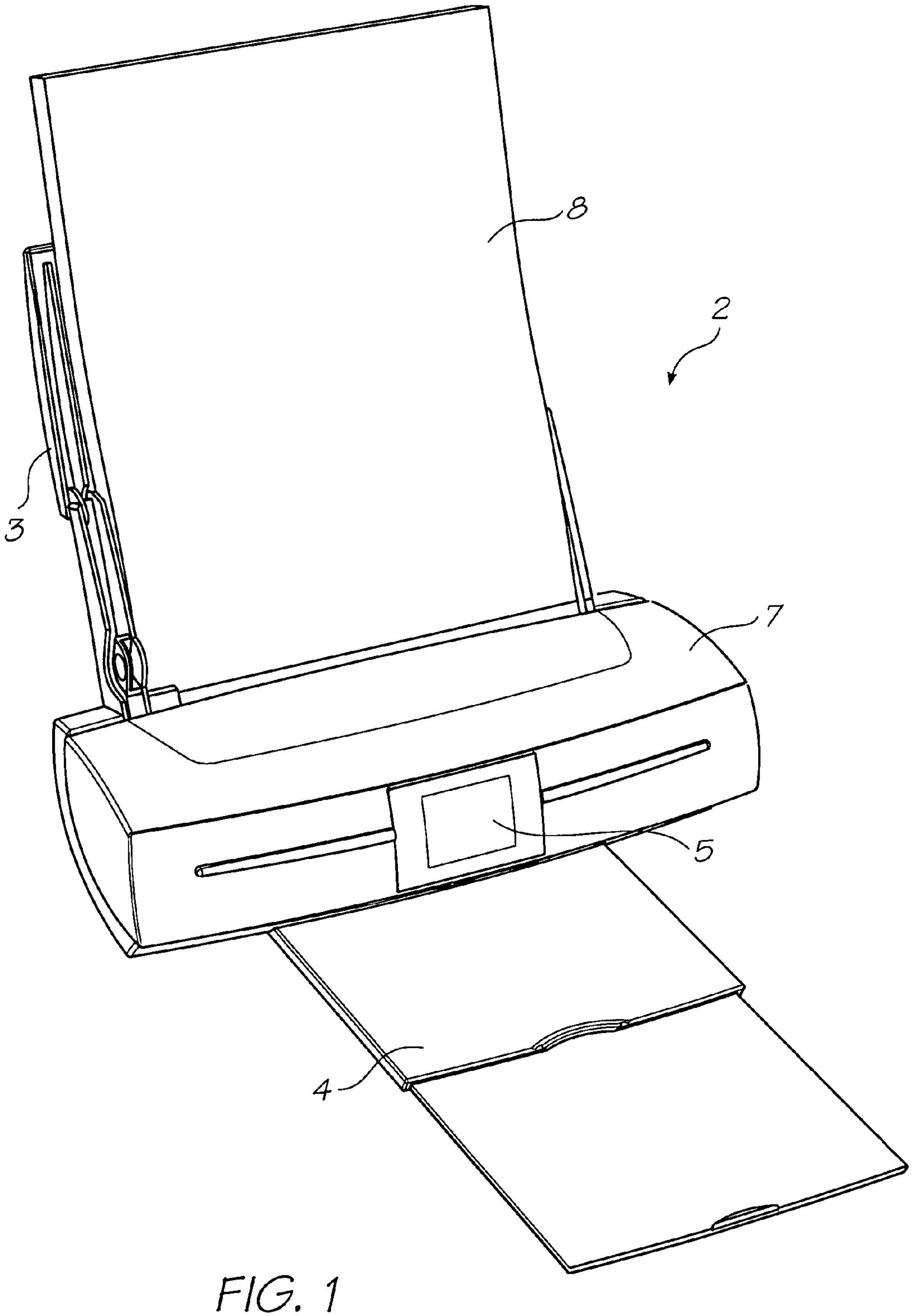
FIG. 1 shows a front perspective view of a printer with paper in the input tray and the collection tray extended.

FIG. 1 shows a printer unit 2 comprising a media supply tray 3, which supports and supplies media 8 to be printed by the print engine (concealed within the printer casing). Printed sheets of media 8 are fed from the print engine to a media output tray 4 for collection. User interface 5 is an LCD touch screen and enables a user to control the operation of the printer unit 2.

Figure 2:
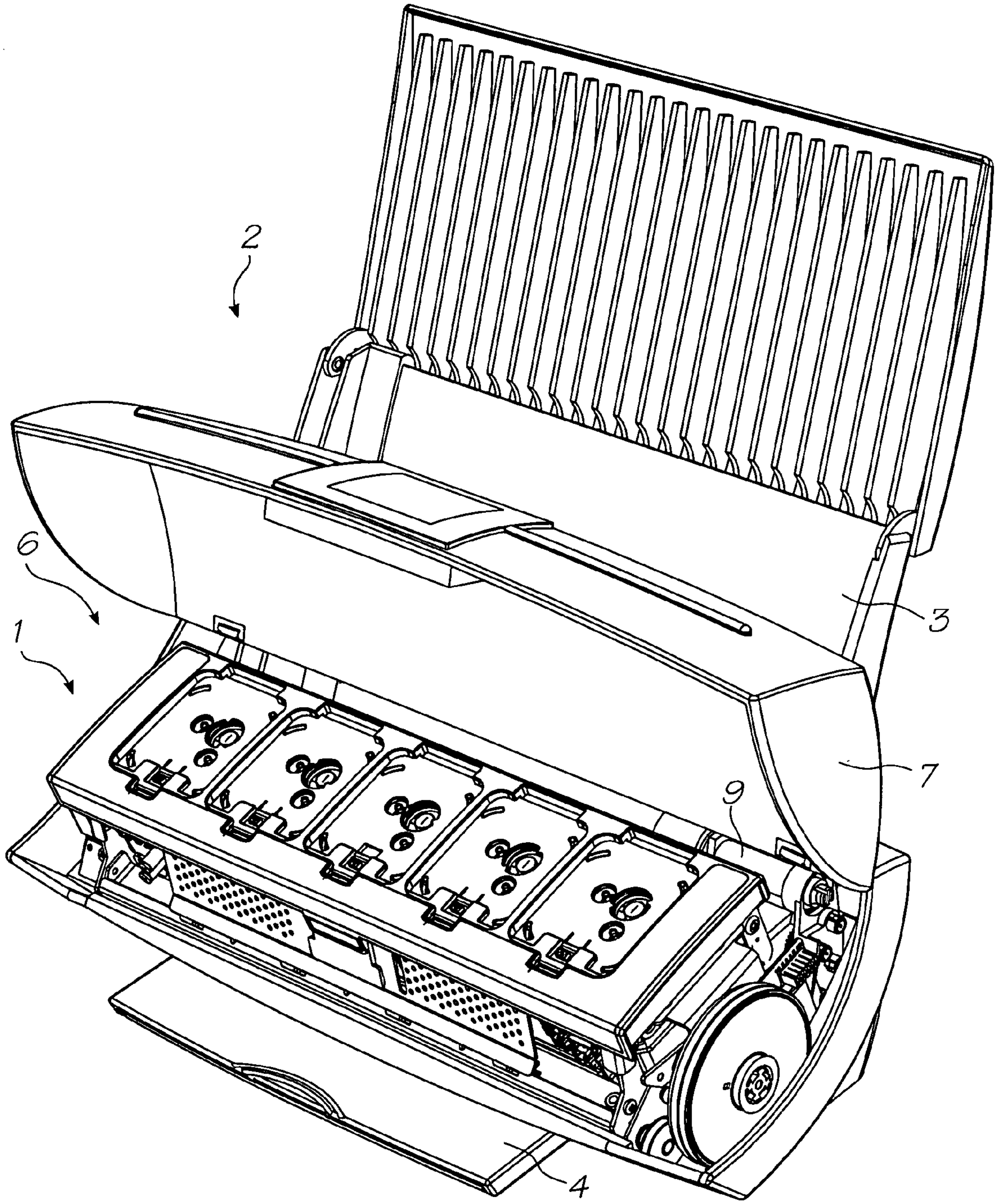
FIG. 2 shows the printer unit of FIG. 1 (without paper in the input tray and with the collection tray retracted) with the casing open to expose the interior.

FIG. 2 shows the lid 7 of the printer unit 2 open to expose the print engine 1 positioned in the internal cavity 6. Picker mechanism 9 engages the media in the input tray 3 (not shown for clarity) and feeds individual streets to the print engine 1. The print engine 1 includes media transport means that takes the individual sheets and feeds them past a printhead assembly (described below) for printing and subsequent delivery to the media output tray 4 (shown retracted).

Print Engine

Figure 3:
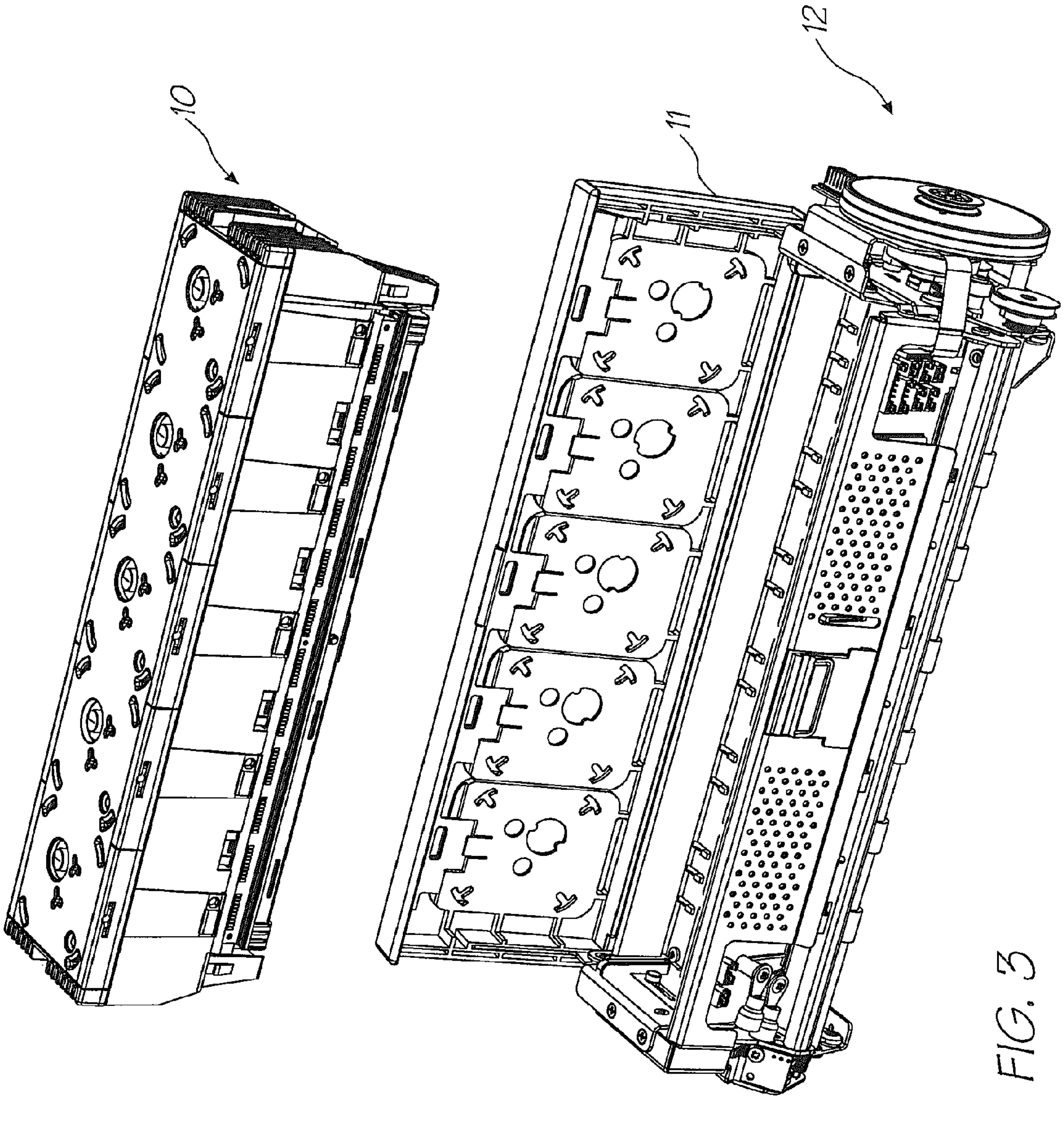
FIG. 3 shows a perspective view of a cradle unit with open cover assembly and cartridge unit removed therefrom.
Figure 4:
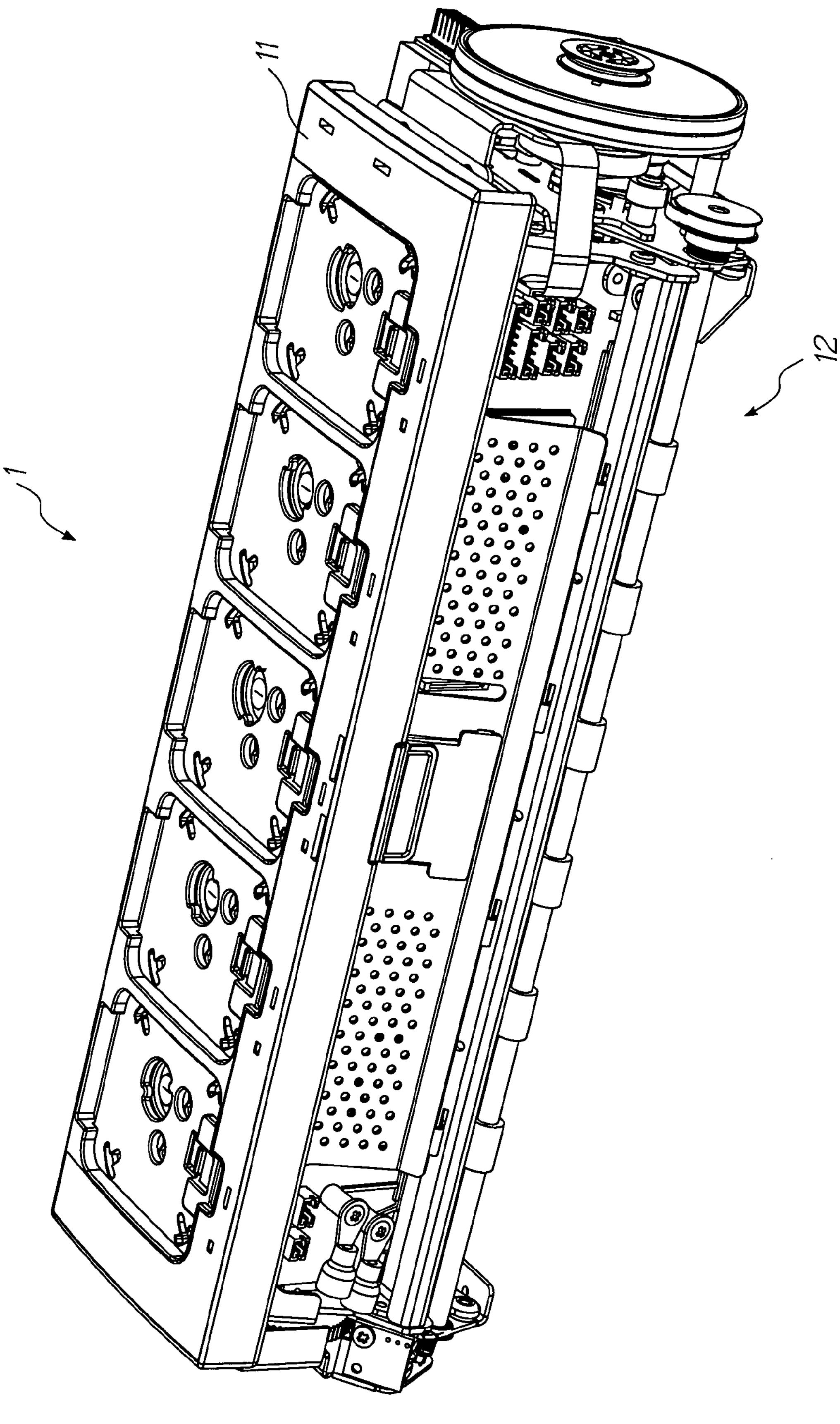
FIG. 4 shows the cradle unit of FIG. 3 with the cover assembly in its closed position.

The print engine 1 is shown in detail in FIGS. 3 and 4 and consists of two main parts: a cartridge unit 10 and a cradle unit 12.

The cartridge unit 10 is shaped and sized to be received within the cradle unit 12 and secured in position by a cover assembly 11 mounted to the cradle unit. The cradle unit 12 is in turn configured to be fixed within the printer unit 2 to facilitate printing as discussed above.

FIG. 4 shows the print engine 1 in its assembled form with cartridge unit 10 secured in the cradle unit 12 and cover assembly 11 closed. The print engine 1 controls various aspects associated with printing in response to user inputs from the user interface 5 of the printer unit 2. These aspects include transporting the media past the printhead in a controlled manner and the controlled ejection of ink onto the surface of the passing media.

Cartridge Unit

Figure 5:
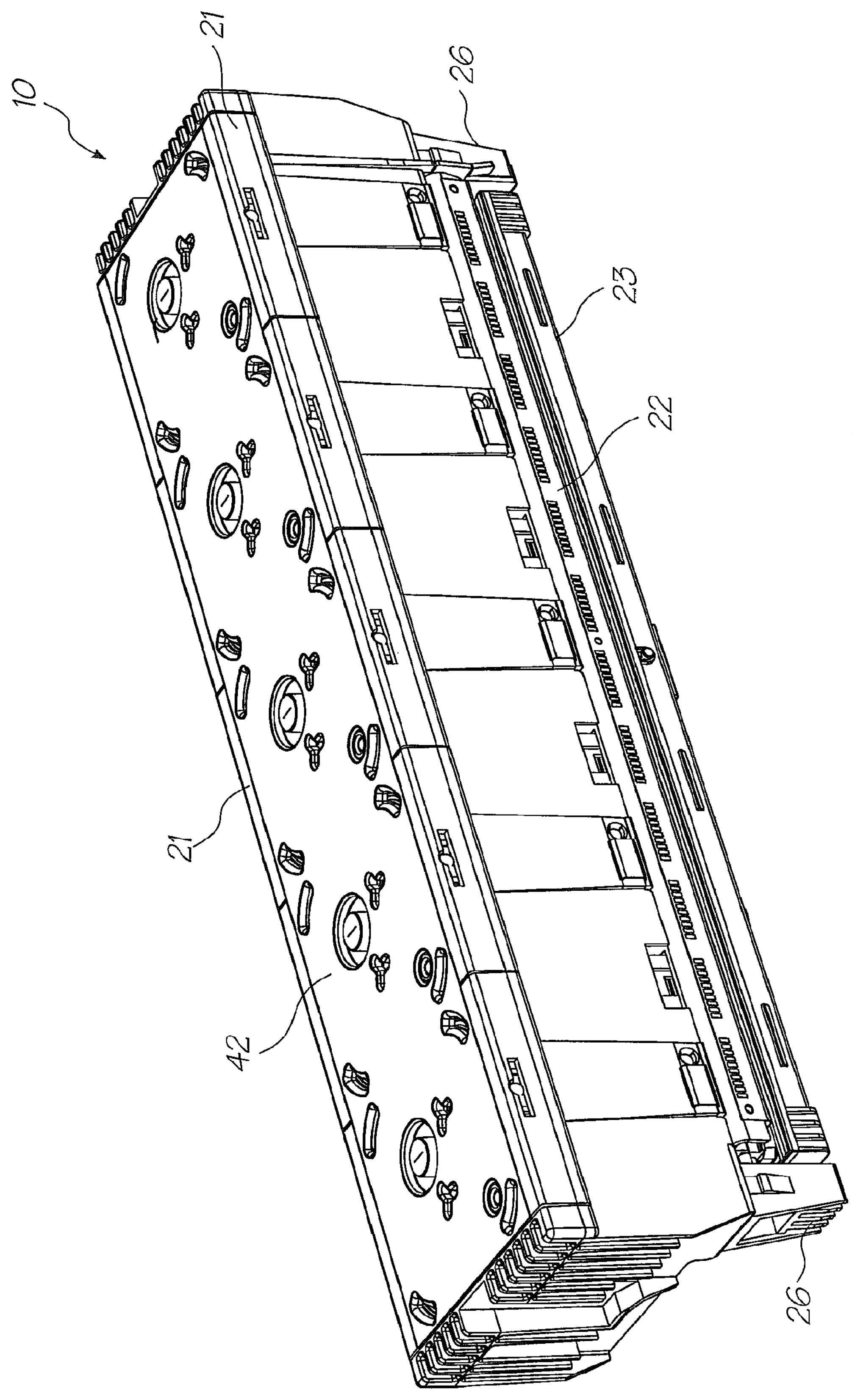
FIG. 5 shows a front perspective view of the cartridge unit of FIG. 3.
Figure 6:
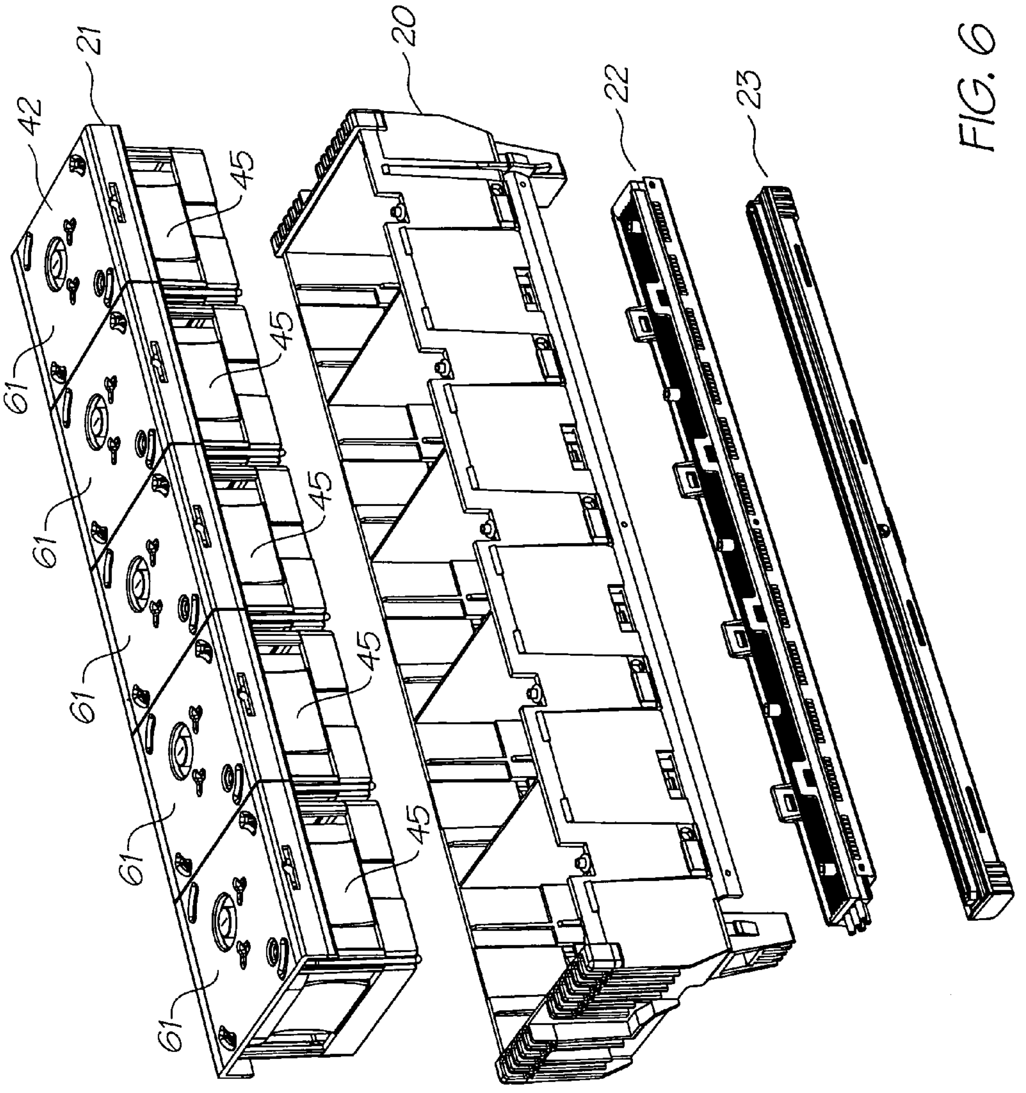
FIG. 6 shows an exploded perspective view of the cartridge unit of FIG. 5.
Figure 7:
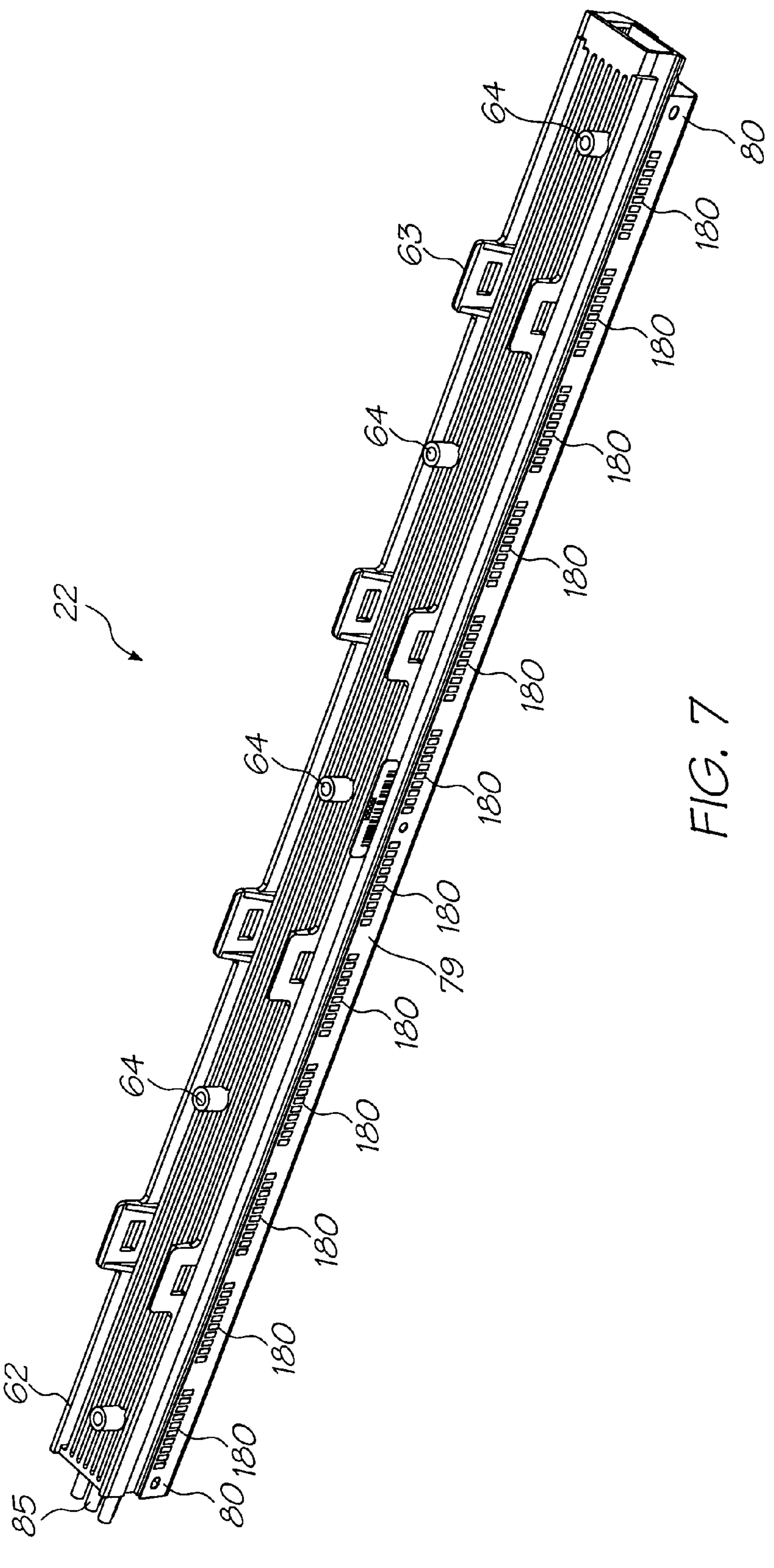
FIG. 7 shows a top perspective view of the printhead assembly shown in FIG. 6.

The cartridge unit 10 is shown in detail in FIGS. 5 and 6. With reference to the exploded view of FIG. 6, the cartridge unit 10 generally consists of a main body 20, an ink storage module assembly 21, a printhead assembly 22 and a maintenance assembly 23.

Each of these parts are assembled together to form an integral unit which combines ink storage means together with the ink ejection means. Such an arrangement ensures that the ink is directly supplied to the printhead assembly 22 for printing, as required, and should there be a need to replace either or both of the ink storage or the printhead assembly, this can be readily done by replacing the entire cartridge unit 10.

However, the operating life of the printhead is not limited by the supply of ink. The top surface 42 of the cartridge unit 10 has interfaces 61 for docking with a refill supply of ink to replenish the ink storage modules 45 when necessary. To further extend the life of the printhead, the cartridge unit carries an integral printhead maintenance assembly 23 that caps, wipes and moistens the printhead.

Printhead Assembly

The printhead assembly 22 is shown in more detail in FIGS. 7 to 10, and is adapted to be attached to the underside of the main body 20 to receive ink.

The printhead assembly 22 generally comprises an elongate upper member 62 which is configured to extends beneath the main body 20, between the posts 26. A plurality of U-shaped clips 63 project from the upper member 62 for securing the printhead assembly 22 to the main body 20.

The upper element 62 has a plurality of feed tubes 64 that receive ink from the main body 20. The feed tubes 64 may be provided with an outer coating to guard against ink leakage.

The upper member 62 is made from a liquid crystal polymer (LCP) which offers a number of advantages. It can be molded so that its coefficient of thermal expansion (CTE) is similar to that of silicon. It will be appreciated that any significant difference in the CTE's of the printhead integrated circuit 74 (discussed below) and the underlying moldings can cause the entire structure to bow. However, as the CTE of LCP in the mold direction is much less than that in the non-mold direction (~5 ppm/° C. compared to ~20 ppm/° C.), care must be take to ensure that the mold direction of the LCP moldings is unidirectional with the longitudinal extent of the printhead integrated circuit (IC) 74. LCP also has a relatively high stiffness with a modulus that is typically 5 times that of 'normal plastics' such as polycarbonates, styrene, nylon, PET and polypropylene.

Figure 8:
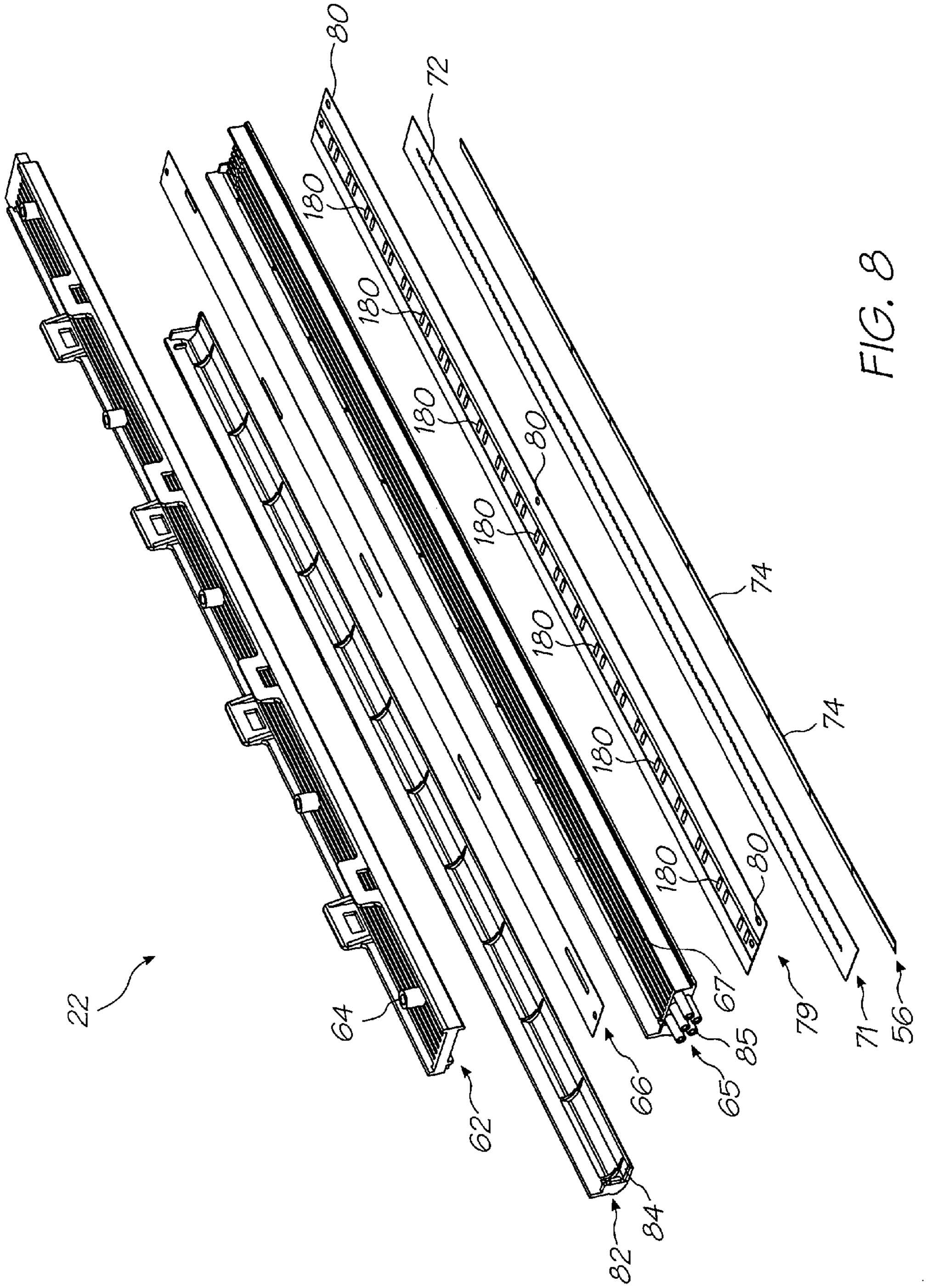
FIG. 8 shows an exploded view of the printhead assembly shown in FIG. 7.

As best shown in FIG. 8, upper member 62 has an open channel configuration for receiving a lower member 65, which is bonded thereto, via an adhesive film 66. The lower member 65 is also made from an LCP and has a plurality of ink channels 67 formed along its length. Each of the ink channels 67 receive ink from one of the feed tubes 64, and distribute the ink along the length of the printhead assembly 22. The channels are 1 mm wide and separated by 0.75 mm thick walls.

In the embodiment shown, the lower member 65 has five channels 67 extending along its length. Each channel 67 receives ink from only one of the five feed tubes 64, which in turn receives ink from one of the ink storage modules 45 (see FIG. 9) to reduce the risk of mixing different coloured inks. In this regard, adhesive film 66 also acts to seal the individual ink channels 67 to prevent cross channel mixing of the ink when the lower member 65 is assembled to the upper member 62.

Figure 15A:
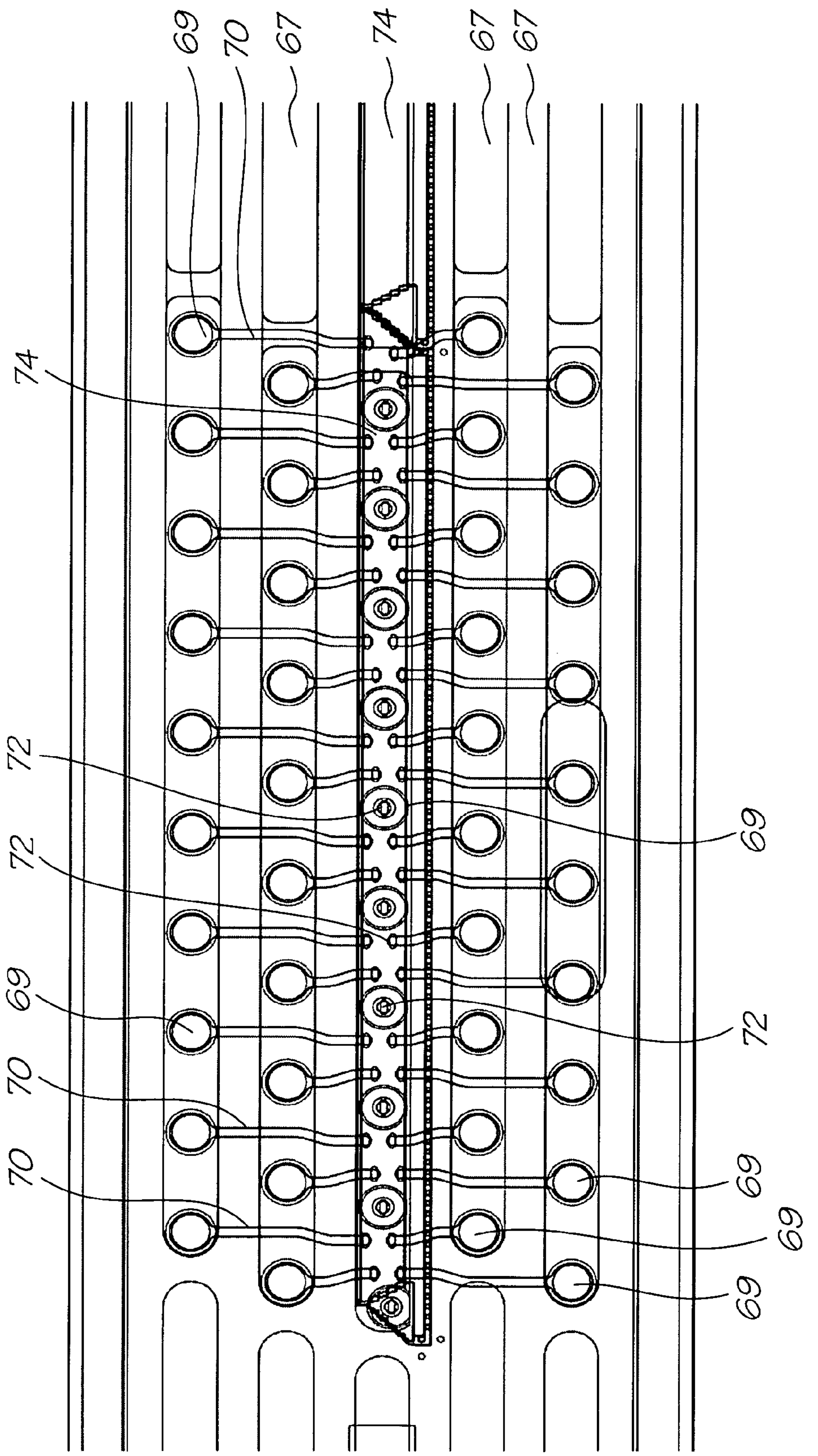
FIG. 15A shows a transparent top view of a printhead assembly of FIG. 7 showing in particular, the ink conduits for supplying ink to the printhead integrated circuits.

In the bottom of each channel 67 are a series of equispaced holes 69 (best seen in FIG. 9) to give five rows of holes 69 in the bottom surface of the lower member 65. The middle row of holes 69 extends along the centre-line of the lower member 65, directly above the printhead IC 74. As best seen in FIG. 15, other rows of holes 69 on either side of the middle row need conduits 70 from each hole 69 to the centre so that ink can be fed to the printhead IC 74.

Figure 9:
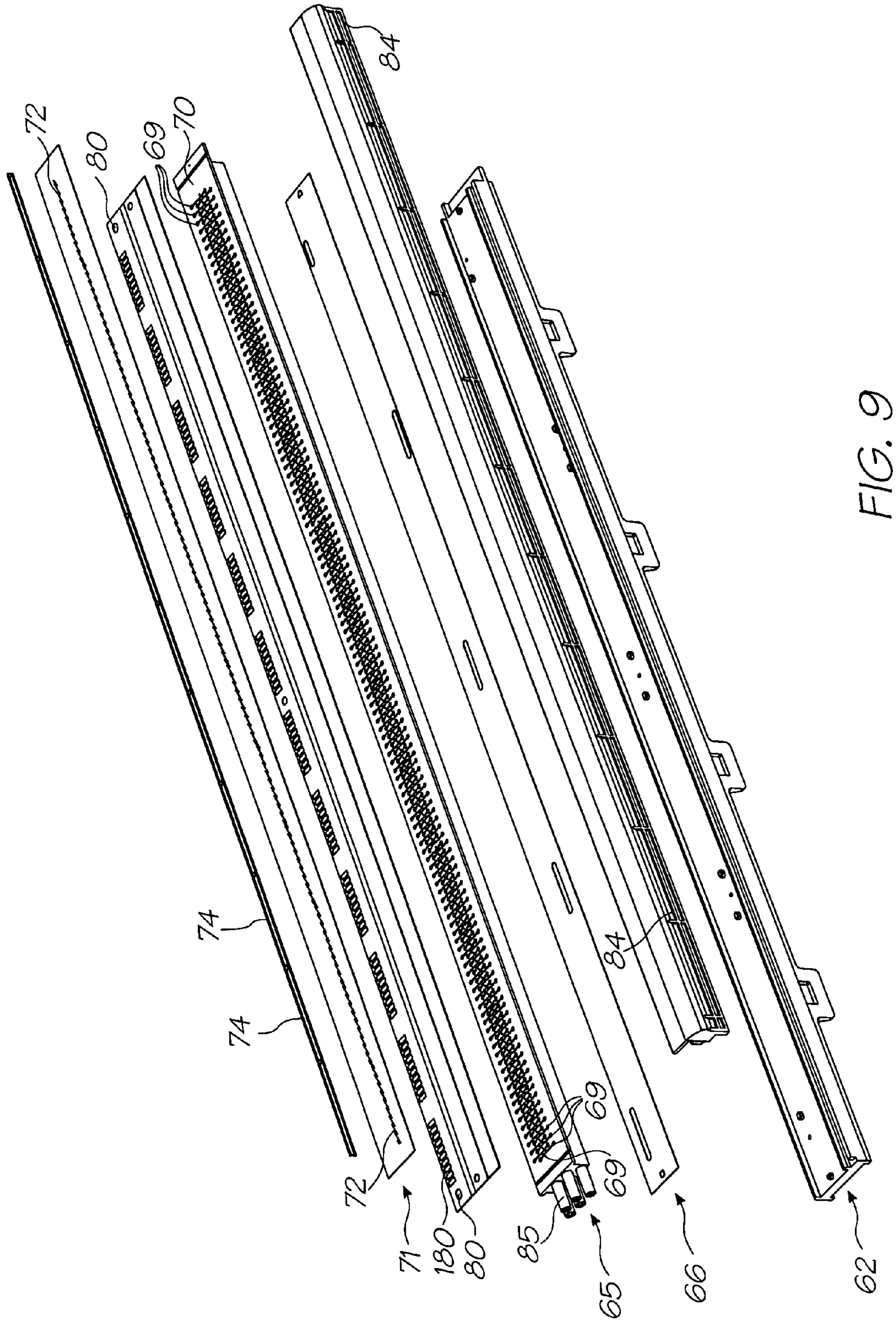
FIG. 9 shows an inverted exploded view of the printhead assembly shown in FIG. 7.
Figure 10:
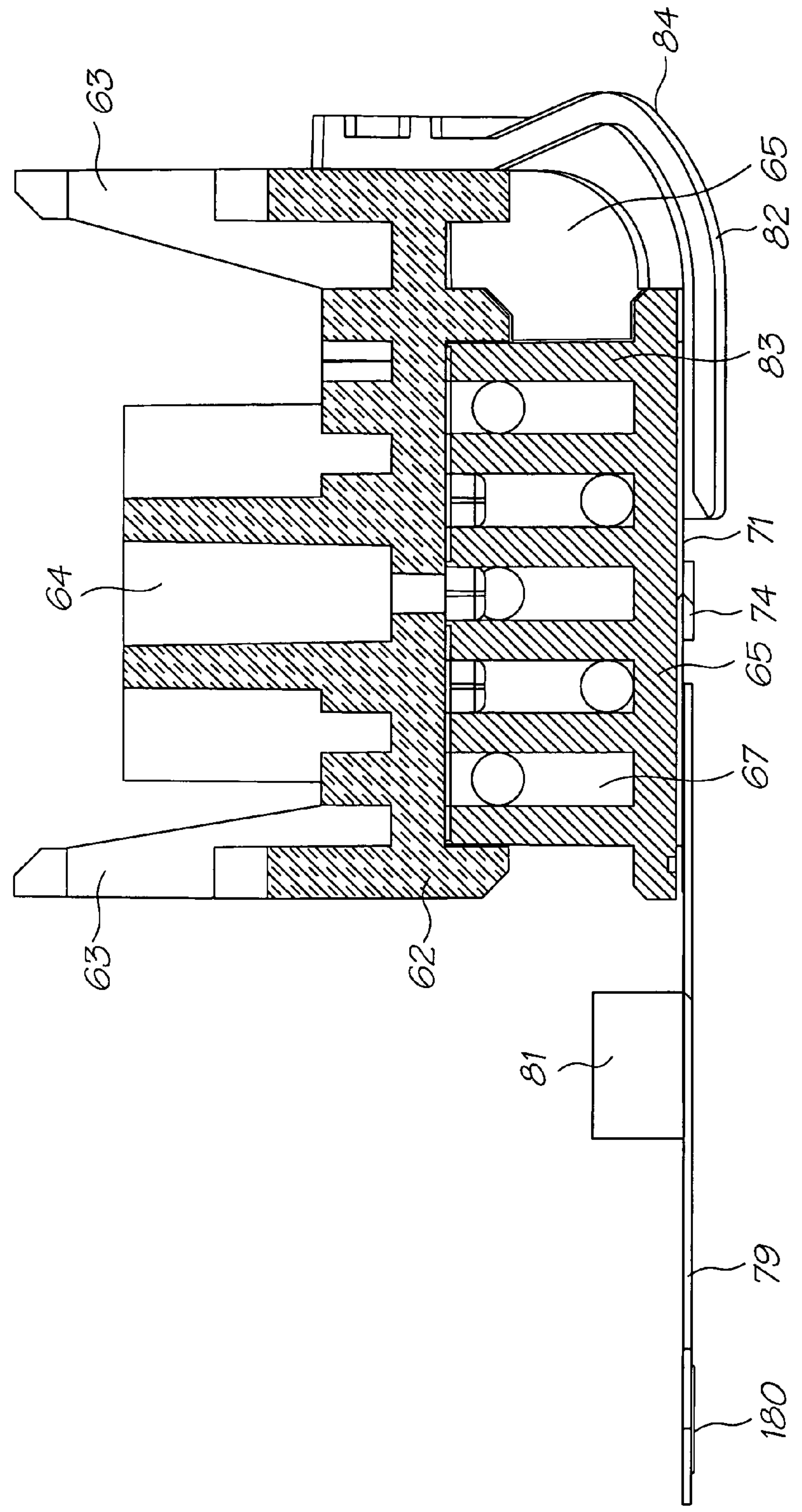
FIG. 10 shows a cross-sectional end view of the printhead assembly of FIG. 7.
Figure 14:
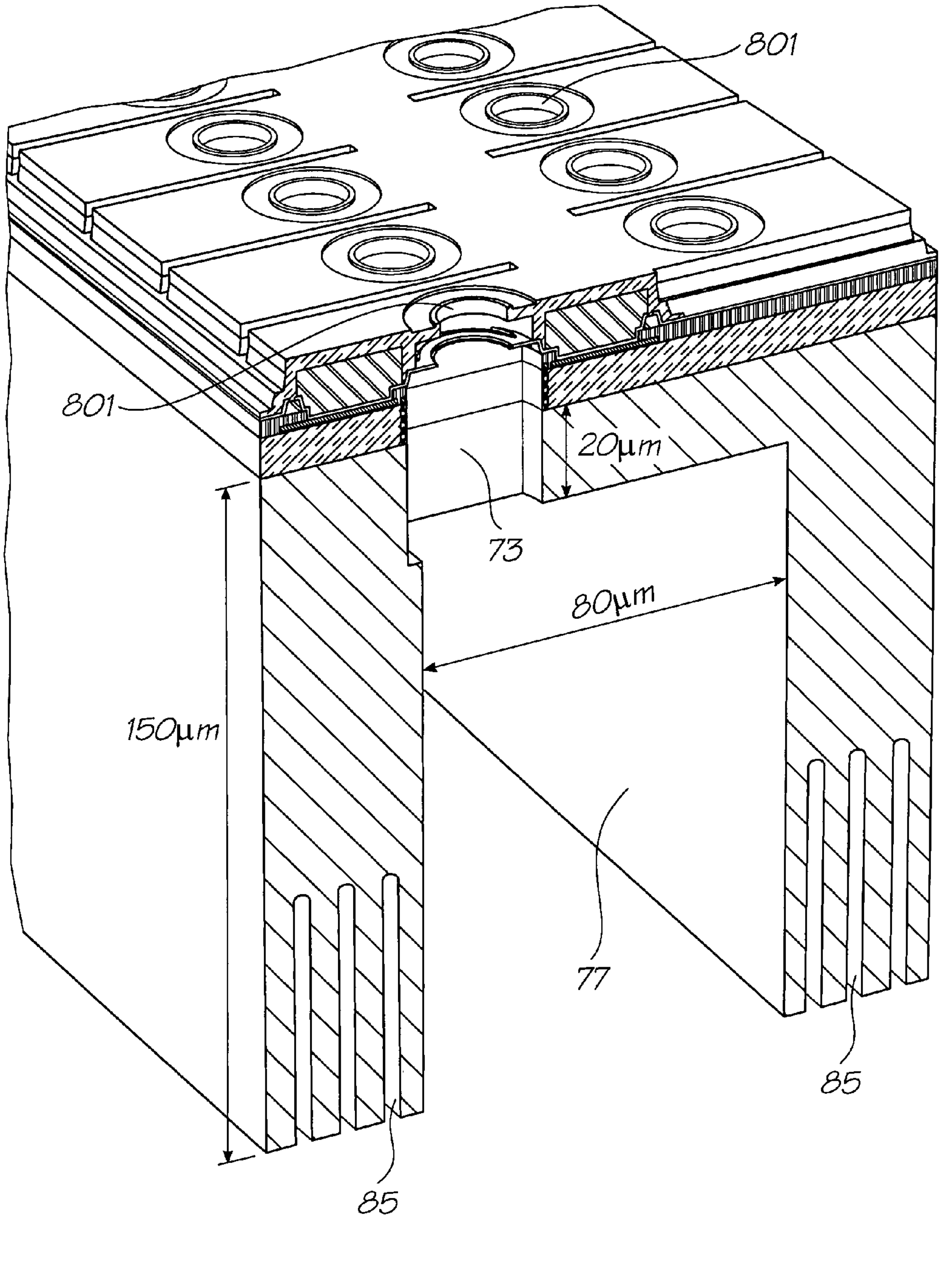
FIG. 14 shows a perspective transverse sectional view of an ink supply channel shown in FIG. 13.

Referring to FIG. 10, the printhead IC 74 is mounted to the underside of the lower member 65 by a polymer sealing film 71. This film may be a thermoplastic film such as a PET or Polysulphone film, or it may be in the form of a thermoset film, such as those manufactured by AL technologies and Rogers Corporation. The polymer sealing film 71 is a laminate with adhesive layers on both sides of a central film, and laminated onto the underside of the lower member 65. As shown in FIGS. 9, 14 and 15, a plurality of holes 72 are laser drilled through the adhesive film 71 to coincide with the centrally disposed ink delivery points (the middle row of holes 69 and the ends of the conduits 70) for fluid communication between the printhead IC 74 and the channels 67.

Figure 13:
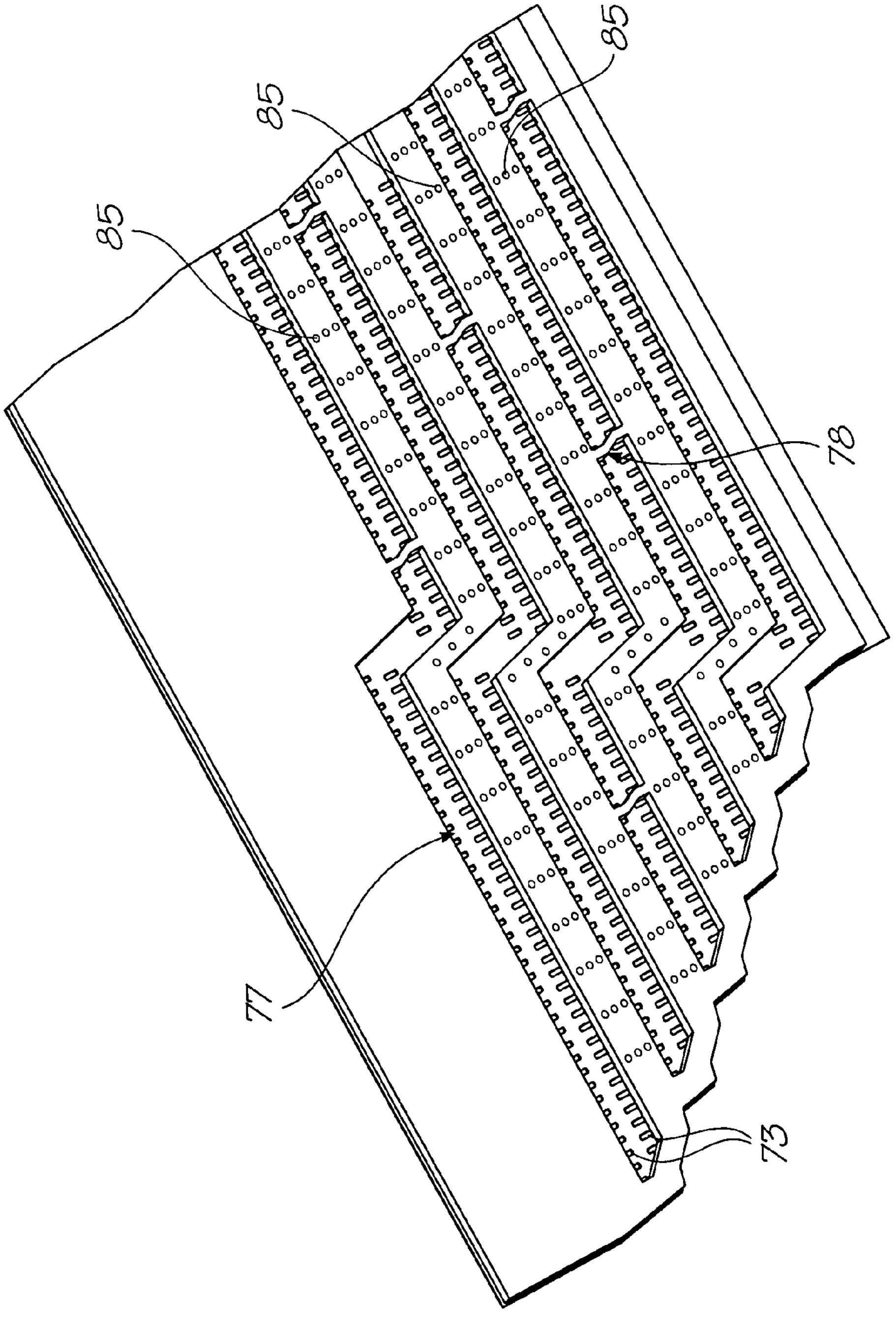
FIG. 13 shows an underside view of the printhead integrated circuit shown in FIG. 11.

The thickness of the polymer sealing film 71 is critical to the effectiveness of the ink seal it provides. As best seen in FIGS. 13 and 15, the polymer sealing film seals the etched channels 77 on the reverse side of the printhead IC 74, as well as the conduits 70 on the other side of the film. However, as the film 71 seals across the open end of the conduits 70, it can also bulge or sag into the conduit. The section of film that sags into a conduit 70 runs across several of the etched channels 77 in the printhead IC 74. The sagging may cause a gap between the walls separating each of the etched channels 77. Obviously, this breaches the seal and allows ink to leak out of the printhead IC 74 and or between etched channels 77.

To guard against this, the polymer sealing film 71 should be thick enough to account for any sagging into the conduits 70 while maintaining the seal over the etched channels 77. The minimum thickness of the polymer sealing film 71 will depend on:

1. the width of the conduit into which it sags;
2. the thickness of the adhesive layers in the film's laminate structure;
3. the 'stiffness' of the adhesive layer as the printhead IC 74 is being pushed into it; and,
4. the modulus of the central film material of the laminate.

A polymer sealing film 71 thickness of 25 microns is adequate for the printhead assembly 22 shown. However, increasing the thickness to 50, 100 or even 200 microns will correspondingly increase the reliability of the seal provided.

Ink delivery inlets 73 are formed in the 'front' surface of a printhead IC 74. The inlets 73 supply ink to respective nozzles 801 (described below with reference to FIGS. 16 to 31) positioned on the inlets. The ink must be delivered to the IC's so as to supply ink to each and every individual inlet 73. Accordingly, the inlets 73 within an individual printhead IC 74 are physically grouped to reduce ink supply complexity and wiring complexity. They are also grouped logically to minimize power consumption and allow a variety of printing speeds.

Figure 11:
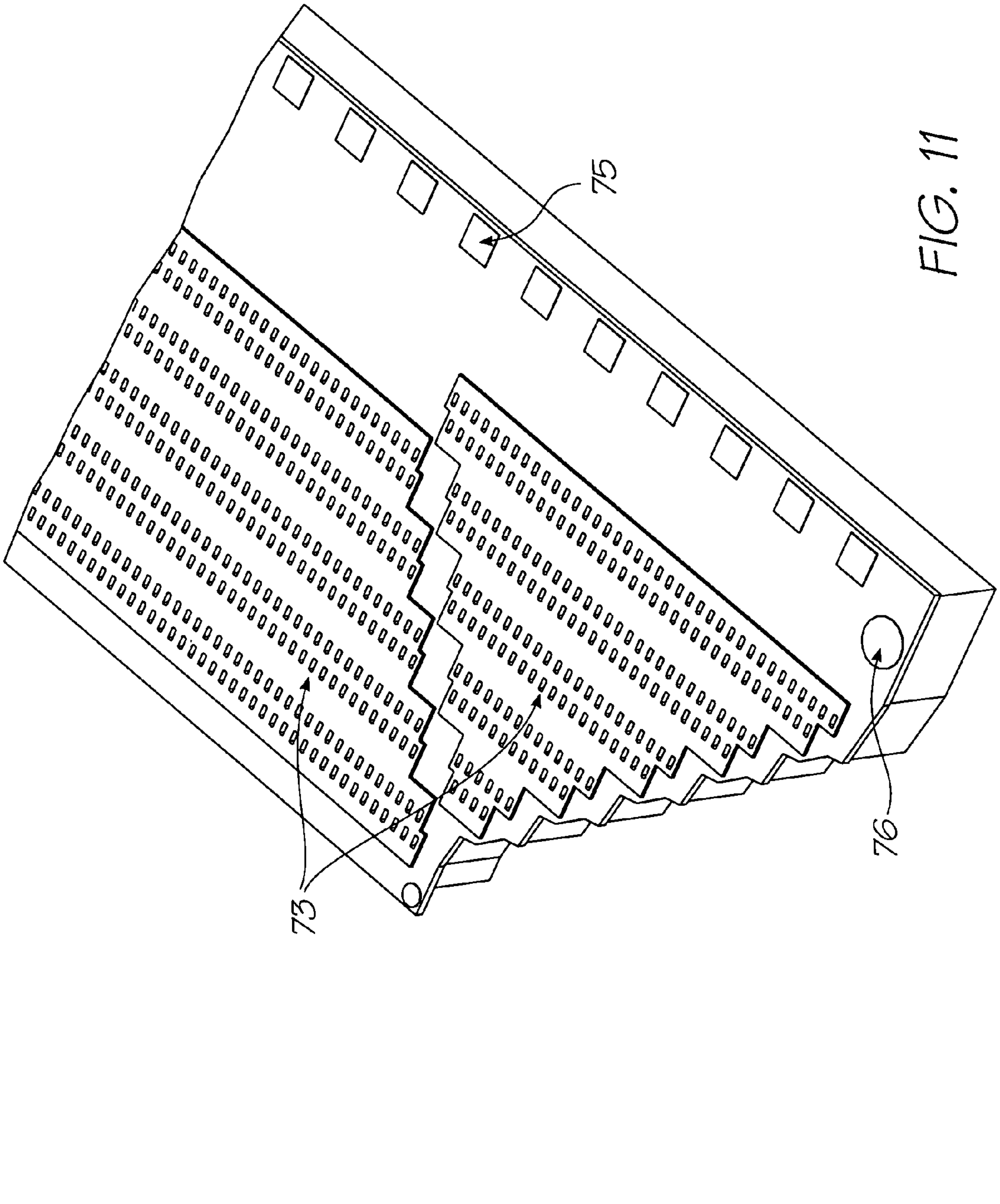
FIG. 11 shows a magnified partial perspective view of the drop triangle end of a printhead integrated circuit module as shown in FIGS. 8 to 10.

Each printhead IC 74 is configured to receive and print five different colours of ink (C, M, Y, K and IR) and contains 1280 ink inlets per colour, with these nozzles being divided into even and odd nozzles (640 each). Even and odd nozzles for each colour are provided on different rows on the printhead IC 74 and are aligned vertically to perform true 1600 dpi printing, meaning that nozzles 801 are arranged in 10 rows, as clearly shown in FIG. 11. The horizontal distance between two adjacent nozzles 801 on a single row is 31.75 microns, whilst the vertical distance between rows of nozzles is based on the firing order of the nozzles, but rows are typically separated by an exact number of dot lines, plus a fraction of a dot line corresponding to the distance the paper will move between row firing times. Also, the spacing of even and odd rows of nozzles for a given colour must be such that they can share an ink channel, as will be described below.

The printhead ICs 74 are arranged to extend horizontally across the width of the printhead assembly 22. To achieve this, individual printhead ICs 74 are linked together in abutting arrangement across the surface of the adhesive layer 71, as shown in FIGS. 8 and 9. The printhead IC's 74 may be attached to the polymer sealing film 71 by heating the IC's above the melting point of the adhesive layer and then pressing them into the sealing film 71, or melting the adhesive layer under the IC with a laser before pressing them into the film. Another option is to both heat the IC (not above the adhesive melting point) and the adhesive layer, before pressing it into the film 71.

Referring to FIGS. 13 and 14, a plurality of trenches 85 are etched into the backside of each printhead IC 74. These trenches provide additional surface area for the adhesive to bond with the printhead IC 74. Once the film 71 is heated above the adhesive melting point, the adhesive flows into the trenches 85 when the printhead IC 74 is pressed against the film. The adhesive may be drawn into the trenches by a capillary action or it may simply be pressed into the trenches during bonding, depending on the surface tension of the adhesive and the dimensions of the trenches. The trenches 85 are etched into the backside of the printhead IC 74 at the wafer stage, at the same time as the channels 77 are etched.

If the printhead IC 74 is heated prior to bonding, then a partial vacuum is created in the trenches 85, above the adhesive received in the trenches, when the printhead IC cools down. This partial vacuum assists in holding the printhead IC 74 in position against the film 71 and maintains it in proper alignment during bonding.

The length of an individual printhead IC 74 is around 20-22 mm. To print an A4/US letter sized page, 11-12 individual printhead ICs 74 are contiguously linked together. The number of individual printhead ICs 74 may be varied to accommodate sheets of other widths.

Figure 12:
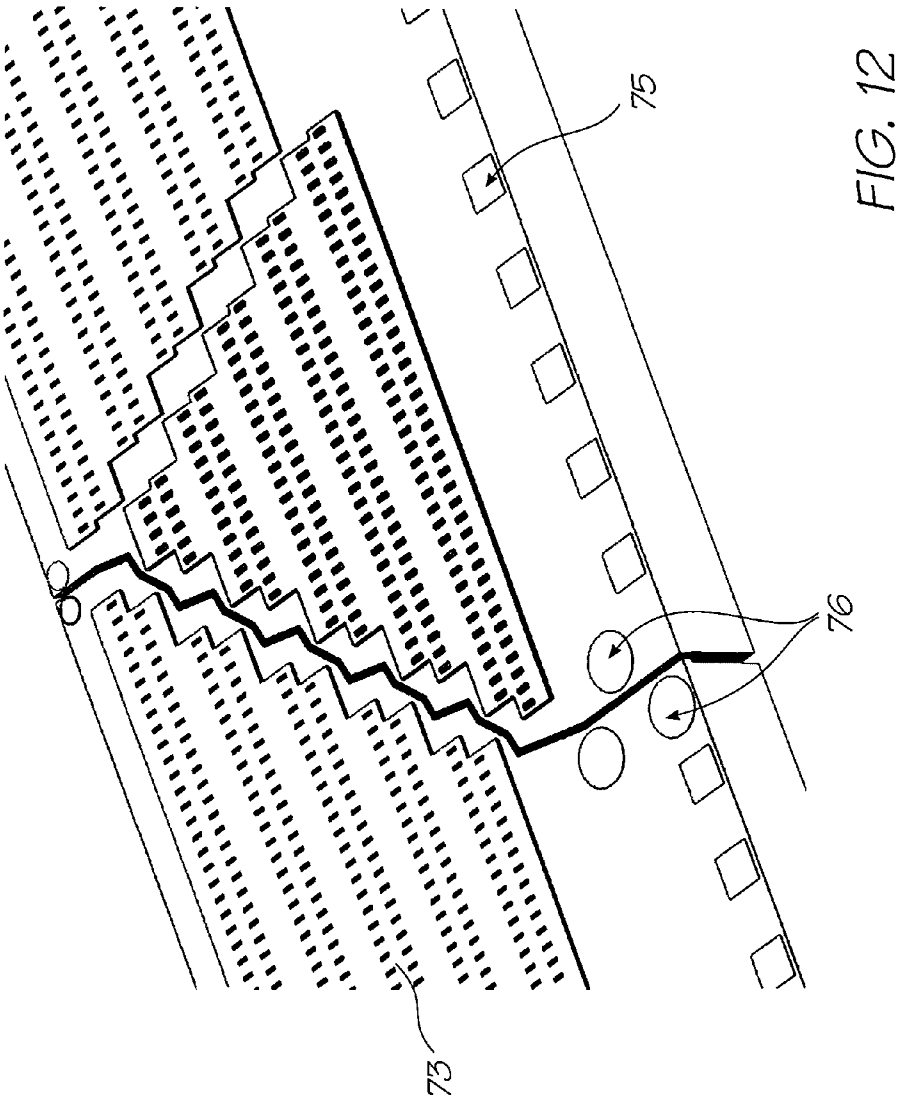
FIG. 12 shows a magnified perspective view of the join between two printhead integrated circuit modules shown in FIGS. 8 to 11.

The printhead ICs 74 may be linked together in a variety of ways. One particular manner for linking the ICs 74 is shown in FIG. 12. In this arrangement, the ICs 74 are shaped at their ends to link together to form a horizontal line of ICs, with no vertical offset between neighboring ICs. A sloping join is provided between the ICs having substantially a 45° angle. The joining edge is not straight and has a sawtooth profile to facilitate positioning, and the ICs 74 are intended to be spaced about 11 microns apart, measured perpendicular to the joining edge. In this arrangement, the left most ink delivery nozzles 73 on each row are dropped by 10 line pitches and arranged in a triangle configuration. This arrangement provides a degree of overlap of nozzles at the join and maintains the pitch of the nozzles to ensure that the drops of ink are delivered consistently along the printing zone. This arrangement also ensures that more silicon is provided at the edge of the IC 74 to ensure sufficient linkage. Whilst control of the operation of the nozzles is performed by the SoPEC device (discussed later in the description), compensation for the nozzles may be performed in the printhead, or may also be performed by the SoPEC device, depending on the storage requirements. In this regard it will be appreciated that the dropped triangle arrangement of nozzles disposed at one end of the IC 74 provides the minimum on-printhead storage requirements. However where storage requirements are less critical, shapes other than a triangle can be used, for example, the dropped rows may take the form of a trapezoid.

The upper surface of the printhead ICs have a number of bond pads 75 provided along an edge thereof which provide a means for receiving data and or power to control the operation of the nozzles 73 from the SoPEC device. To aid in positioning the ICs 74 correctly on the surface of the adhesive layer 71 and aligning the ICs 74 such that they correctly align with the holes 72 formed in the adhesive layer 71, fiducials 76 are also provided on the surface of the ICs 74. The fiducials 76 are in the form of markers that are readily identifiable by appropriate positioning equipment to indicate the true position of the IC 74 with respect to a neighbouring IC and the surface of the adhesive layer 71, and are strategically positioned at the edges of the ICs 74, and along the length of the adhesive layer 71.

In order to receive the ink from the holes 72 formed in the polymer sealing film 71 and to distribute the ink to the ink inlets 73, the underside of each printhead IC 74 is configured as shown in FIG. 13. A number of etched channels 77 are provided, with each channel 77 in fluid communication with a pair of rows of inlets 73 dedicated to delivering one particular colour or type of ink. The channels 77 are about 80 microns wide, which is equivalent to the width of the holes 72 in the polymer sealing film 71, and extend the length of the IC 74. The channels 77 are divided into sections by silicon walls 78. Each sections is directly supplied with ink, to reduce the flow path to the inlets 73 and the likelihood of ink starvation to the individual nozzles 801. In this regard, each section feeds approximately 128 nozzles 801 via their respective inlets 73.

Figure 15B:
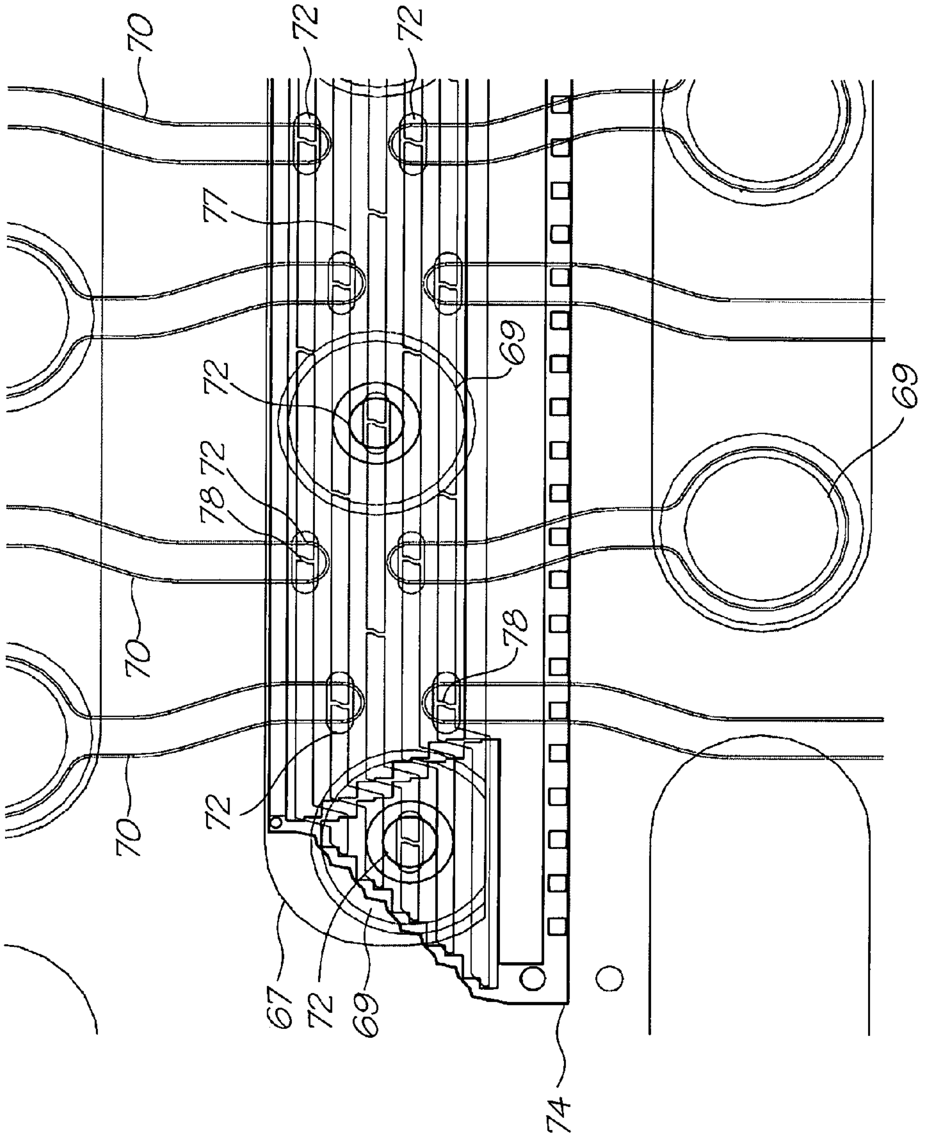
FIG. 15B is a partial enlargement of FIG. 15A.

FIG. 15B shows more clearly how the ink is fed to the etched channels 77 formed in the underside of the ICs 74 for supply to the nozzles 73. As shown, holes 72 formed through the polymer sealing film 71 are aligned with one of the channels 77 at the point where the silicon wall 78 separates the channel 77 into sections. The holes 72 are about 80 microns in width which is substantially the same width of the channels 77 such that one hole 72 supplies ink to two sections of the channel 77. It will be appreciated that this halves the density of holes 72 required in the polymer sealing film 71.

Following attachment and alignment of each of the printhead ICs 74 to the surface of the polymer sealing film 71, a flex PCB 79 (see FIG. 18) is attached along an edge of the ICs 74 so that control signals and power can be supplied to the bond pads 75 to control and operate the nozzles 801. As shown more clearly in FIG. 15, the flex PCB 79 extends from the printhead assembly 22 and folds around the printhead assembly 22.

The flex PCB 79 may also have a plurality of decoupling capacitors 81 arranged along its length for controlling the power and data signals received. As best shown in FIG. 8, the flex PCB 79 has a plurality of electrical contacts 180 formed along its length for receiving power and or data signals from the control circuitry of the cradle unit 12. A plurality of holes 80 are also formed along the distal edge of the flex PCB 79 which provide a means for attaching the flex PCB to the flange portion 40 of the main body 20. The manner in which the electrical contacts of the flex PCB 79 contact the power and data contacts of the cradle unit 12 will be described later.

As shown in FIG. 10, a media shield 82 protects the printhead ICs 74 from damage which may occur due to contact with the passing media. The media shield 82 is attached to the upper member 62 upstream of the printhead ICs 74 via an appropriate clip-lock arrangement or via an adhesive. When attached in this manner, the printhead ICs 74 sit below the surface of the media shield 82, out of the path of the passing media.

A space 83 is provided between the media shield 82 and the upper 62 and lower 65 members which can receive pressurized air from an air compressor or the like. As this space 83 extends along the length of the printhead assembly 22, compressed air can be supplied to the space 56 from either end of the printhead assembly 22 and be evenly distributed along the assembly. The inner surface of the media shield 82 is provided with a series of fins 84 which define a plurality of air outlets evenly distributed along the length of the media shield 82 through which the compressed air travels and is directed across the printhead ICs 74 in the direction of the media delivery. This arrangement acts to prevent dust and other particulate matter carried with the media from settling on the surface of the printhead ICs, which could cause blockage and damage to the nozzles.

Ink Delivery Nozzles

Figure 24:
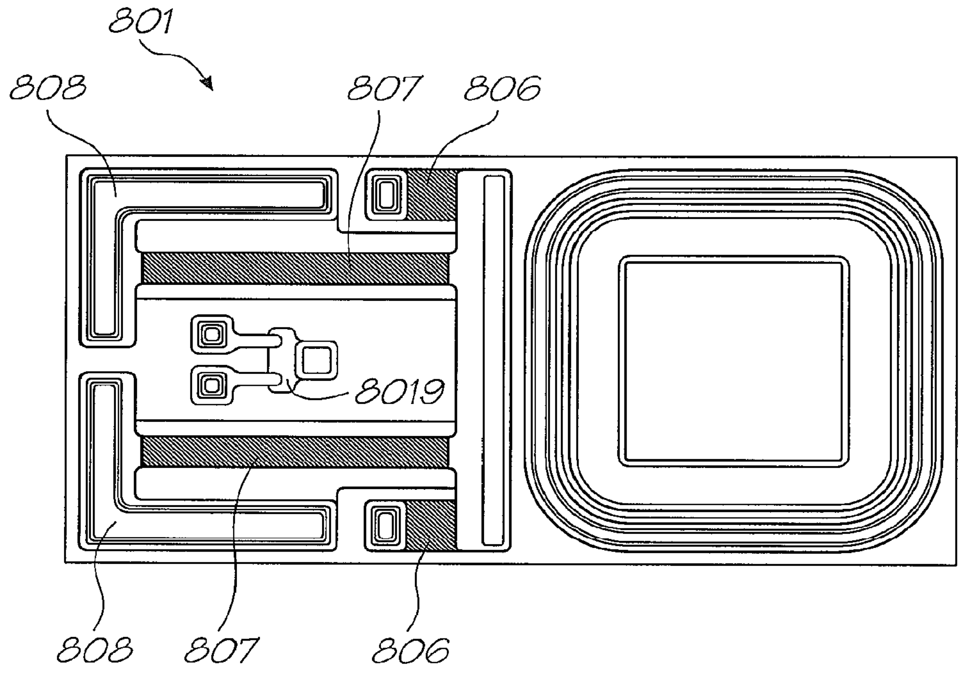
FIG. 24 shows a plan view of the nozzle of FIG. 16 with the lever arm and movable nozzle removed for clarity.
Figure 25:
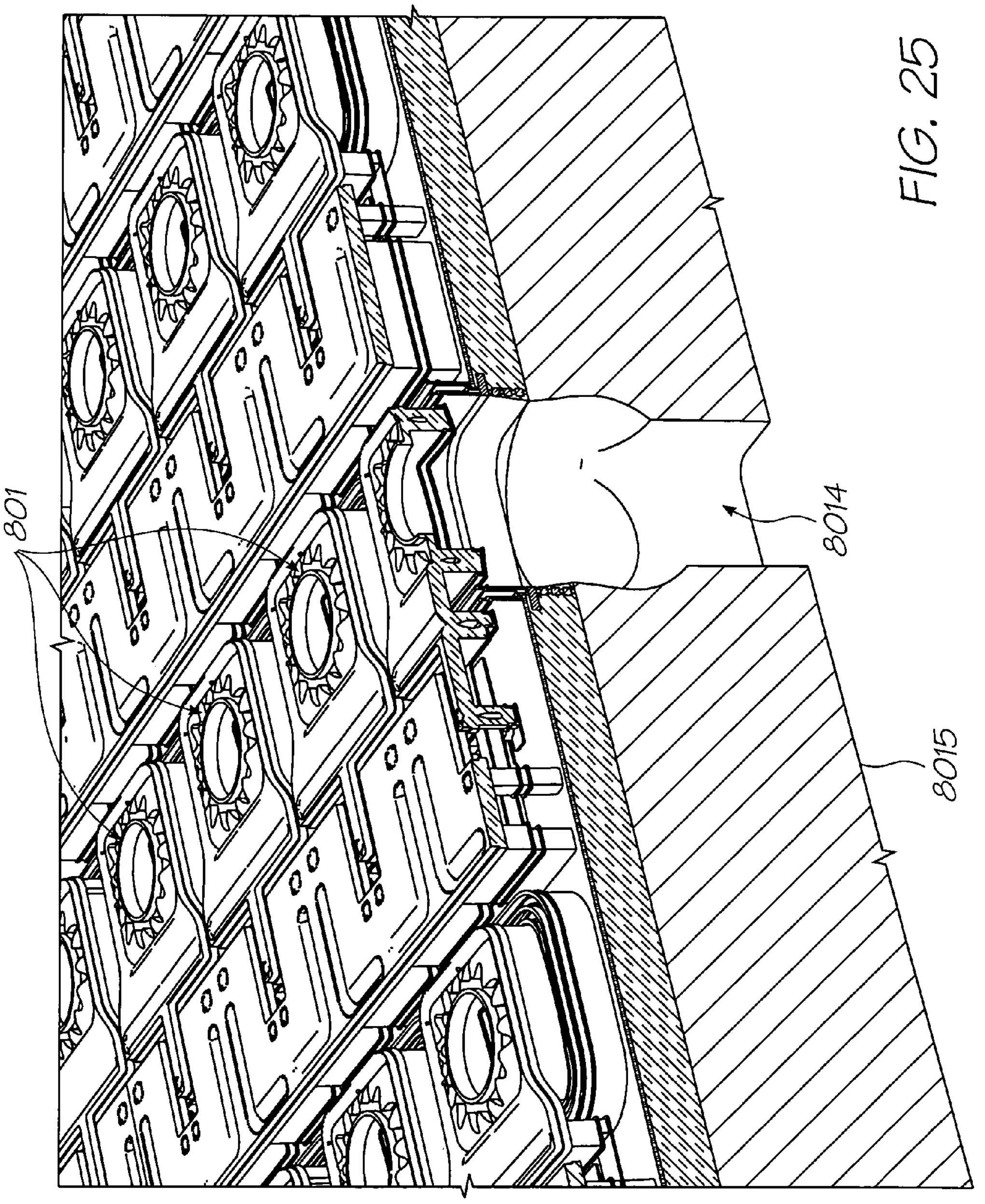
FIG. 25 shows a perspective vertical sectional view of a part of a printhead chip incorporating a plurality of the nozzle arrangements of the type shown in FIG. 16.

Examples of a type of ink delivery nozzle arrangement suitable for printhead ICs 74 will now be described with reference to FIGS. 16 to 25. FIG. 25 shows an array of ink delivery nozzle arrangements 801 formed on a silicon substrate 8015. Each of the nozzle arrangements 801 are identical, however groups of nozzle arrangements 801 are arranged to be fed with different colored inks or fixative. In this regard, the nozzle arrangements are arranged in rows and are staggered with respect to each other, allowing closer spacing of ink dots during printing than would be possible with a single row of nozzles. Such an arrangement makes it possible to provide a high density of nozzles, for example, more than 5000 nozzles arrayed in a plurality of staggered rows each having an interspacing of about 32 microns between the nozzles in each row and about 80 microns between the adjacent rows. The multiple rows also allow for redundancy (if desired), thereby allowing for a predetermined failure rate per nozzle.

Each nozzle arrangement 801 is the product of an integrated circuit fabrication technique. In particular, the nozzle arrangement 801 defines a micro-electromechanical system (MEMS).

For clarity and ease of description, the construction and operation of a single nozzle arrangement 801 will be described with reference to FIGS. 16 to 24.

The ink jet printhead integrated circuit 74 includes a silicon wafer substrate 8015 having 0.35 micron 1 P4M 12 volt CMOS microprocessing electronics is positioned thereon.

A silicon dioxide (or alternatively glass) layer 8017 is positioned on the substrate 8015. The silicon dioxide layer 8017 defines CMOS dielectric layers. CMOS top-level metal defines a pair of aligned aluminium electrode contact layers 8030 positioned on the silicon dioxide layer 8017. Both the silicon wafer substrate 8015 and the silicon dioxide layer 8017 are etched to define an ink inlet channel 8014 having a generally circular cross section (in plan). An aluminium diffusion barrier 8028 of CMOS metal 1, CMOS metal 2/3 and CMOS top level metal is positioned in the silicon dioxide layer 8017 about the ink inlet channel 8014. The diffusion barrier 8028 serves to inhibit the diffusion of hydroxyl ions through CMOS oxide layers of the drive electronics layer 8017.

A passivation layer in the form of a layer of silicon nitride 8031 is positioned over the aluminium contact layers 8030 and the silicon dioxide layer 8017. Each portion of the passivation layer 8031 positioned over the contact layers 8030 has an opening 8032 defined therein to provide access to the contacts 8030.

Figure 19:
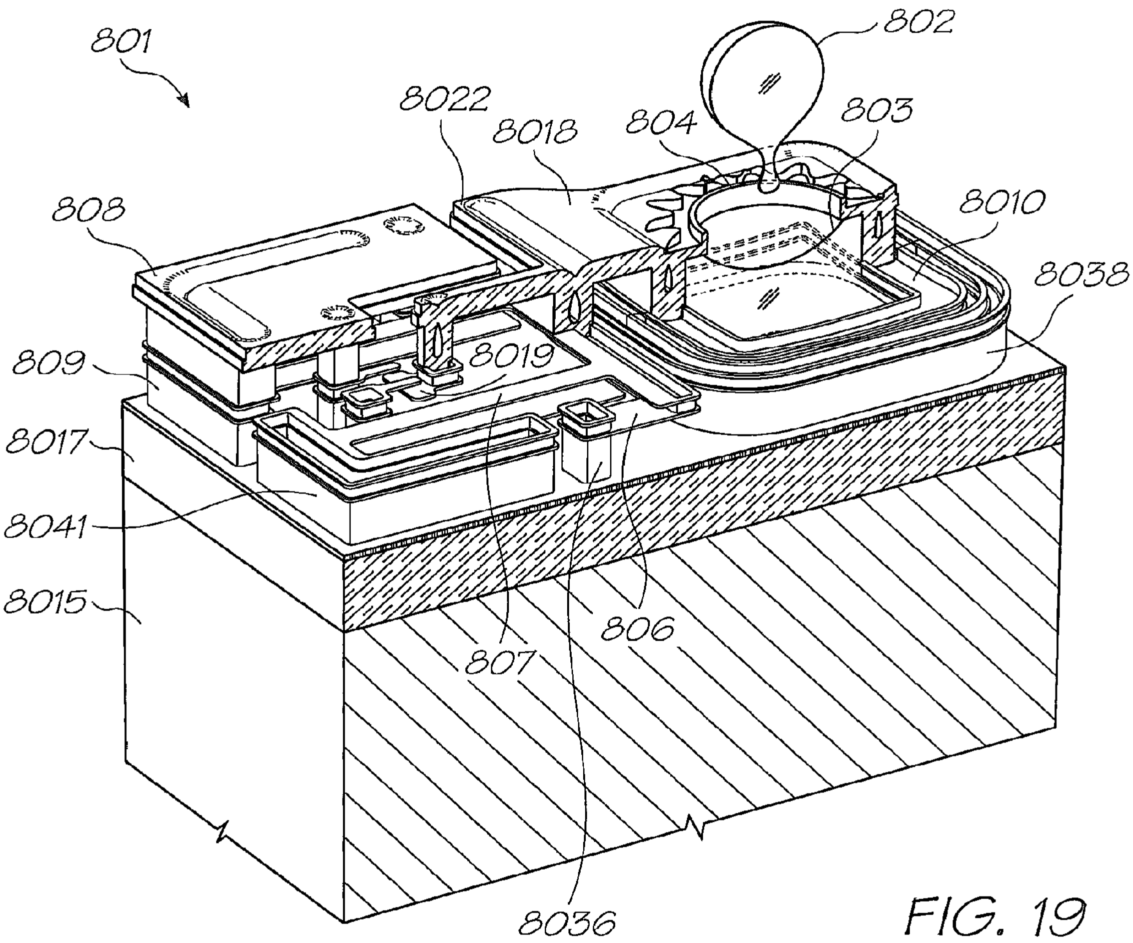
FIG. 19 shows a perspective partial vertical sectional view of the nozzle of FIG. 16, at the actuation state shown in FIG. 18.
Figure 20:
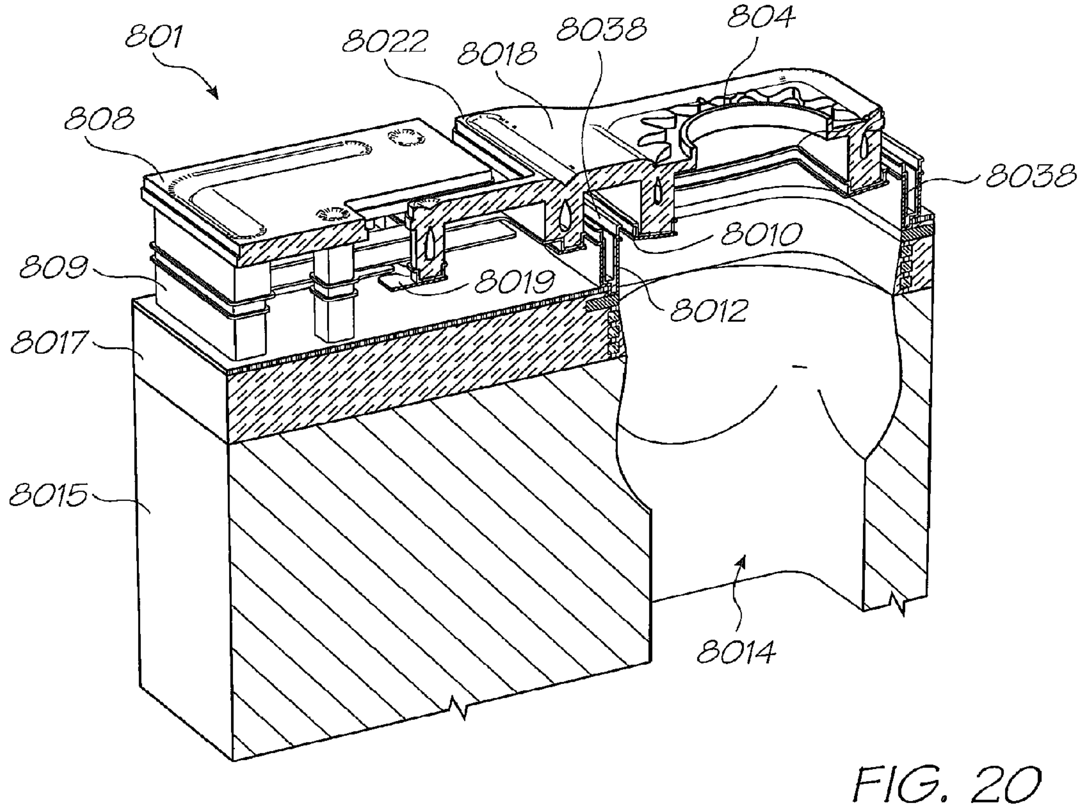
FIG. 20 shows a perspective vertical section of the nozzle of FIG. 16, with ink omitted.
Figure 21:
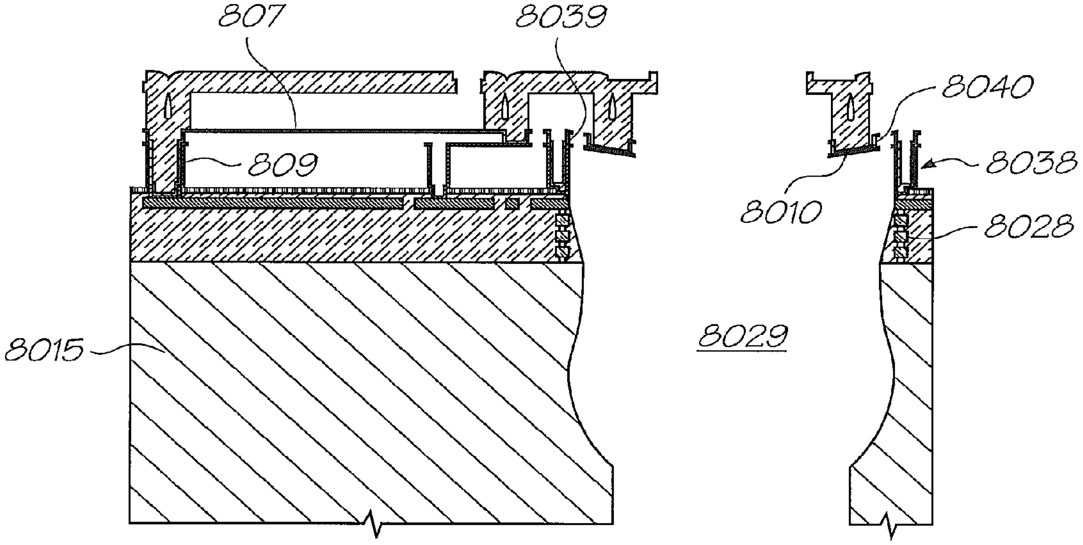
FIG. 21 shows a vertical sectional view of the of the nozzle of FIG. 20.

The nozzle arrangement 801 includes a nozzle chamber 8029 defined by an annular nozzle wall 8033, which terminates at an upper end in a nozzle roof 8034 and a radially inner nozzle rim 804 that is circular in plan. The ink inlet channel 8014 is in fluid communication with the nozzle chamber 8029. At a lower end of the nozzle wall, there is disposed a moving rim 8010, that includes a moving seal lip 8040. An encircling wall 8038 surrounds the movable nozzle, and includes a stationary seal lip 8039 that, when the nozzle is at rest as shown in FIG. 19, is adjacent the moving rim 8010. A fluidic seal 8011 is formed due to the surface tension of ink trapped between the stationary seal lip 8039 and the moving seal lip 8040. This prevents leakage of ink from the chamber whilst providing a low resistance coupling between the encircling wall 8038 and the nozzle wall 8033.

Figure 23:
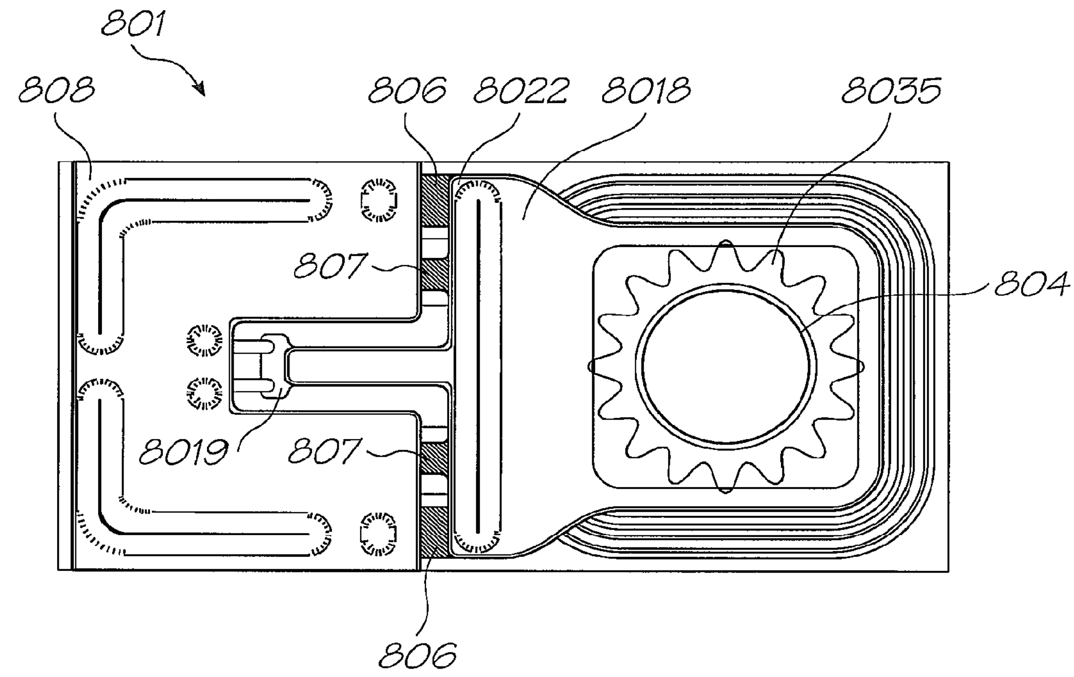
FIG. 23 shows a plan view of the nozzle of FIG. 16.

As best shown in FIG. 23, a plurality of radially extending recesses 8035 is defined in the roof 8034 about the nozzle rim 804. The recesses 8035 serve to contain radial ink flow as a result of ink escaping past the nozzle rim 804.

The nozzle wall 8033 forms part of a lever arrangement that is mounted to a carrier 8036 having a generally U-shaped profile with a base 8037 attached to the layer 8031 of silicon nitride.

The lever arrangement also includes a lever arm 8018 that extends from the nozzle walls and incorporates a lateral stiffening beam 8022. The lever arm 8018 is attached to a pair of passive beams 806, formed from titanium nitride (TiN) and positioned on either side of the nozzle arrangement, as best shown in FIGS. 19 and 24. The other ends of the passive beams 806 are attached to the carrier 8036.

The lever arm 8018 is also attached to an actuator beam 807, which is formed from TiN. It will be noted that this attachment to the actuator beam is made at a point a small but critical distance higher than the attachments to the passive beam 806.

Figure 16:
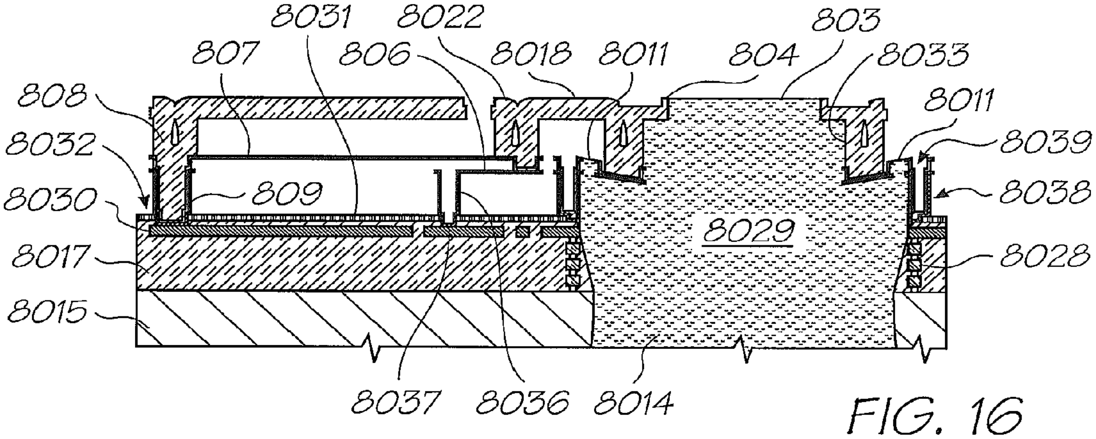
FIG. 16 shows a vertical sectional view of a single nozzle for ejecting ink, for use with the invention, in a quiescent state.
Figure 22:
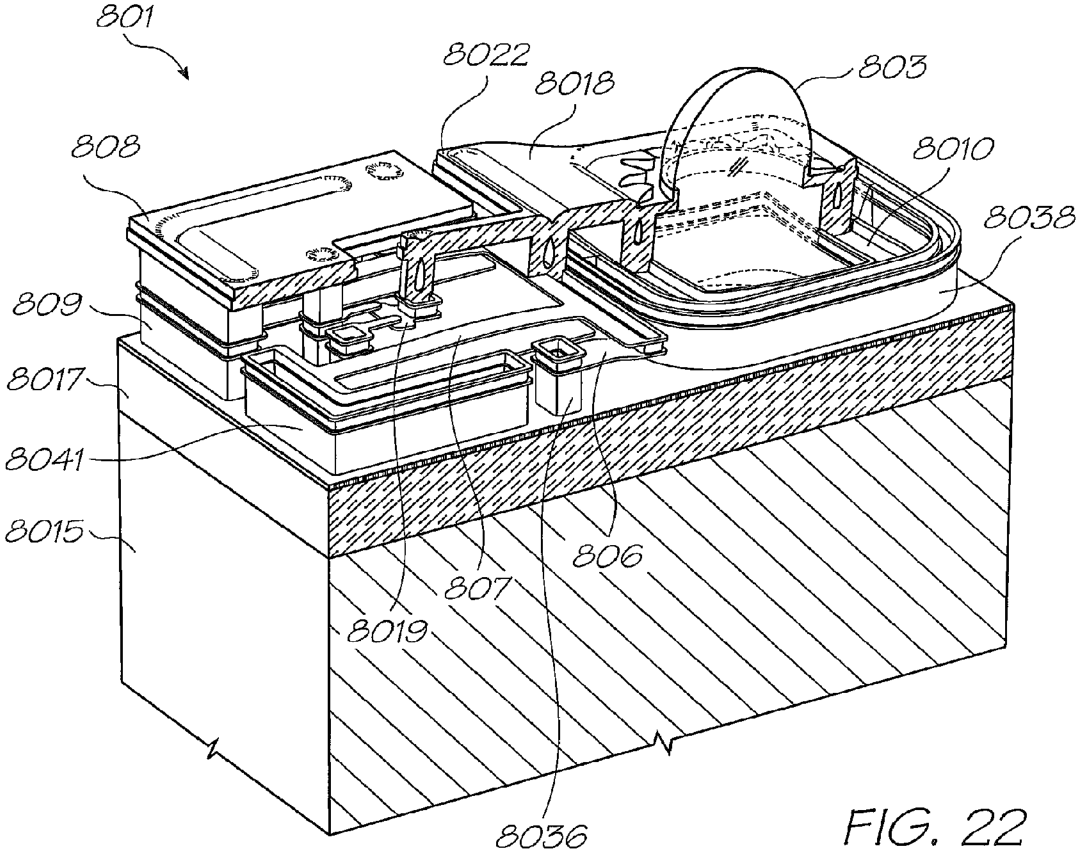
FIG. 22 shows a perspective partial vertical sectional view of the nozzle of FIG. 16, at the actuation state shown in FIG. 17.

As best shown in FIGS. 16 and 22, the actuator beam 807 is substantially U-shaped in plan, defining a current path between the electrode 809 and an opposite electrode 8041. Each of the electrodes 809 and 8041 are electrically connected to respective points in the contact layer 8030. As well as being electrically coupled via the contacts 809, the actuator beam is also mechanically anchored to anchor 808. The anchor 808 is configured to constrain motion of the actuator beam 807 to the left of FIGS. 19 to 21 when the nozzle arrangement is in operation.

The TiN in the actuator beam 807 is conductive, but has a high enough electrical resistance that it undergoes self-heating when a current is passed between the electrodes 809 and 8041. No current flows through the passive beams 806, so they do not expand.

In use, the device at rest is filled with ink 8013 that defines a meniscus 803 under the influence of surface tension. The ink is retained in the chamber 8029 by the meniscus, and will not generally leak out in the absence of some other physical influence.

Figure 17:
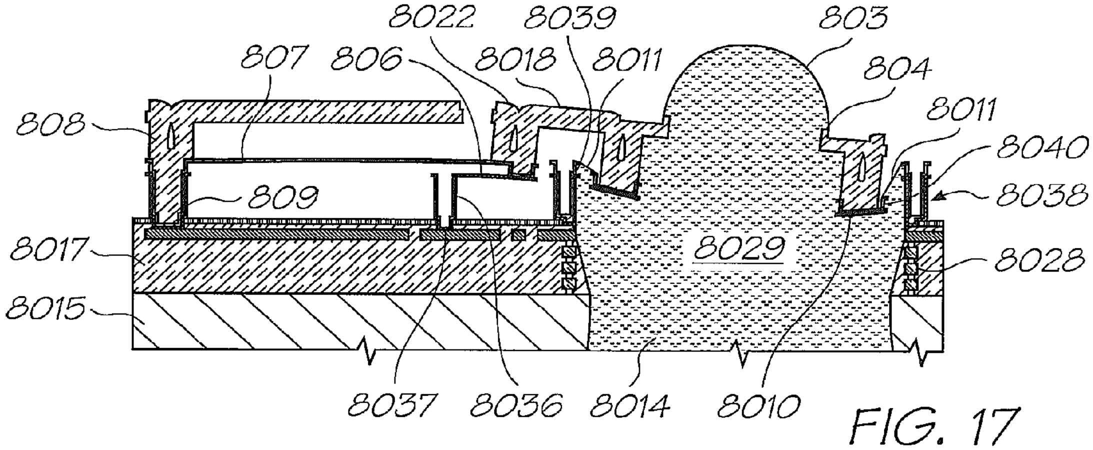
FIG. 17 shows a vertical sectional view of the nozzle of FIG. 16 during an initial actuation phase.

As shown in FIG. 17, to fire ink from the nozzle, a current is passed between the contacts 809 and 8041, passing through the actuator beam 807. The self-heating of the beam 807 due to its resistance causes the beam to expand. The dimensions and design of the actuator beam 807 mean that the majority of the expansion in a horizontal direction with respect to FIGS. 16 to 18. The expansion is constrained to the left by the anchor 808, so the end of the actuator beam 807 adjacent the lever arm 8018 is impelled to the right.

The relative horizontal inflexibility of the passive beams 806 prevents them from allowing much horizontal movement the lever arm 8018. However, the relative displacement of the attachment points of the passive beams and actuator beam respectively to the lever arm causes a twisting movement that causes the lever arm 8018 to move generally downwards. The movement is effectively a pivoting or hinging motion. However, the absence of a true pivot point means that the rotation is about a pivot region defined by bending of the passive beams 806.

The downward movement (and slight rotation) of the lever arm 8018 is amplified by the distance of the nozzle wall 8033 from the passive beams 806. The downward movement of the nozzle walls and roof causes a pressure increase within the chamber 8029, causing the meniscus to bulge as shown in FIG. 17. It will be noted that the surface tension of the ink means the fluid seal 8011 is stretched by this motion without allowing ink to leak out.

Figure 18:
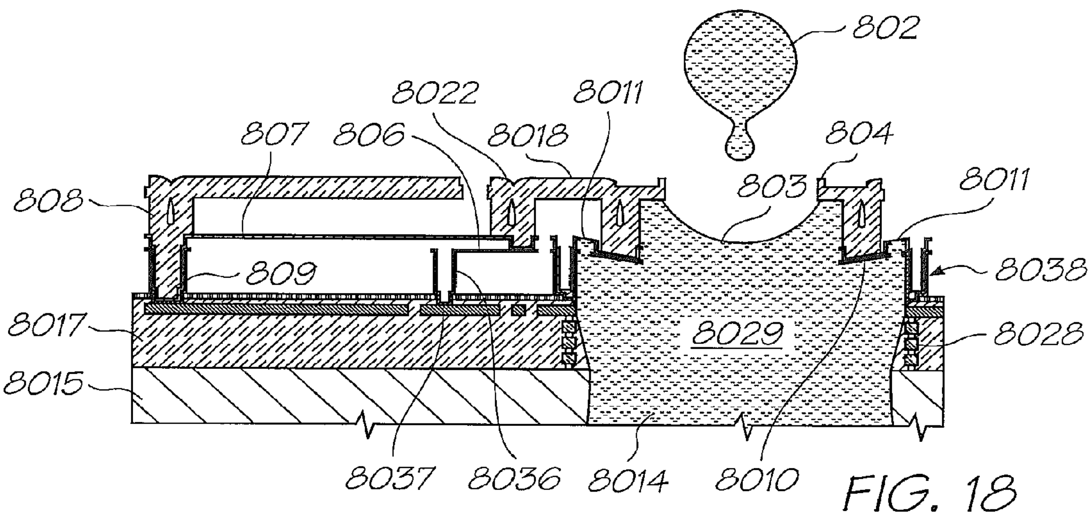
FIG. 18 shows a vertical sectional view of the nozzle of FIG. 17 later in the actuation phase.

As shown in FIG. 18, at the appropriate time, the drive current is stopped and the actuator beam 807 quickly cools and contracts. The contraction causes the lever arm to commence its return to the quiescent position, which in turn causes a reduction in pressure in the chamber 8029. The interplay of the momentum of the bulging ink and its inherent surface tension, and the negative pressure caused by the upward movement of the nozzle chamber 8029 causes thinning, and ultimately snapping, of the bulging meniscus to define an ink drop 802 that continues upwards until it contacts adjacent print media.

Immediately after the drop 802 detaches, meniscus 803 forms the concave shape shown in FIG. 18. Surface tension causes the pressure in the chamber 8029 to remain relatively low until ink has been sucked upwards through the inlet 8014, which returns the nozzle arrangement and the ink to the quiescent situation shown in FIG. 16.

Another type of printhead nozzle arrangement suitable for the printhead ICs 74 will now be described with reference to FIG. 26. Once again, for clarity and ease of description, the construction and operation of a single nozzle arrangement 1001 will be described.

The nozzle arrangement 1001 is of a bubble forming heater element actuator type which comprises a nozzle plate 1002 with a nozzle 1003 therein, the nozzle having a nozzle rim 1004, and aperture 1005 extending through the nozzle plate. The nozzle plate 1002 is plasma etched from a silicon nitride structure which is deposited, by way of chemical vapour deposition (CVD), over a sacrificial material which is subsequently etched.

The nozzle arrangement includes, with respect to each nozzle 1003, side walls 1006 on which the nozzle plate is supported, a chamber 1007 defined by the walls and the nozzle plate 1002, a multi-layer substrate 1008 and an inlet passage 1009 extending through the multi-layer substrate to the far side (not shown) of the substrate. A looped, elongate heater element 1010 is suspended within the chamber 1007, so that the element is in the form of a suspended beam. The nozzle arrangement as shown is a microelectromechanical system (MEMS) structure, which is formed by a lithographic process.

When the nozzle arrangement is in use, ink 1011 from a reservoir (not shown) enters the chamber 1007 via the inlet passage 1009, so that the chamber fills. Thereafter, the heater element 1010 is heated for somewhat less than 1 micro second, so that the heating is in the form of a thermal pulse. It will be appreciated that the heater element 1010 is in thermal contact with the ink 1011 in the chamber 1007 so that when the element is heated, this causes the generation of vapor bubbles in the ink. Accordingly, the ink 1011 constitutes a bubble forming liquid.

The bubble 1012, once generated, causes an increase in pressure within the chamber 1007, which in turn causes the ejection of a drop 1016 of the ink 1011 through the nozzle 1003. The rim 1004 assists in directing the drop 1016 as it is ejected, so as to minimize the chance of a drop misdirection.

The reason that there is only one nozzle 1003 and chamber 1007 per inlet passage 1009 is so that the pressure wave generated within the chamber, on heating of the element 1010 and forming of a bubble 1012, does not effect adjacent chambers and their corresponding nozzles.

The increase in pressure within the chamber 1007 not only pushes ink 1011 out through the nozzle 1003, but also pushes some ink back through the inlet passage 1009. However, the inlet passage 1009 is approximately 200 to 300 microns in length, and is only approximately 16 microns in diameter. Hence there is a substantial viscous drag. As a result, the predominant effect of the pressure rise in the chamber 1007 is to force ink out through the nozzle 1003 as an ejected drop 1016, rather than back through the inlet passage 1009.

Figure 26:
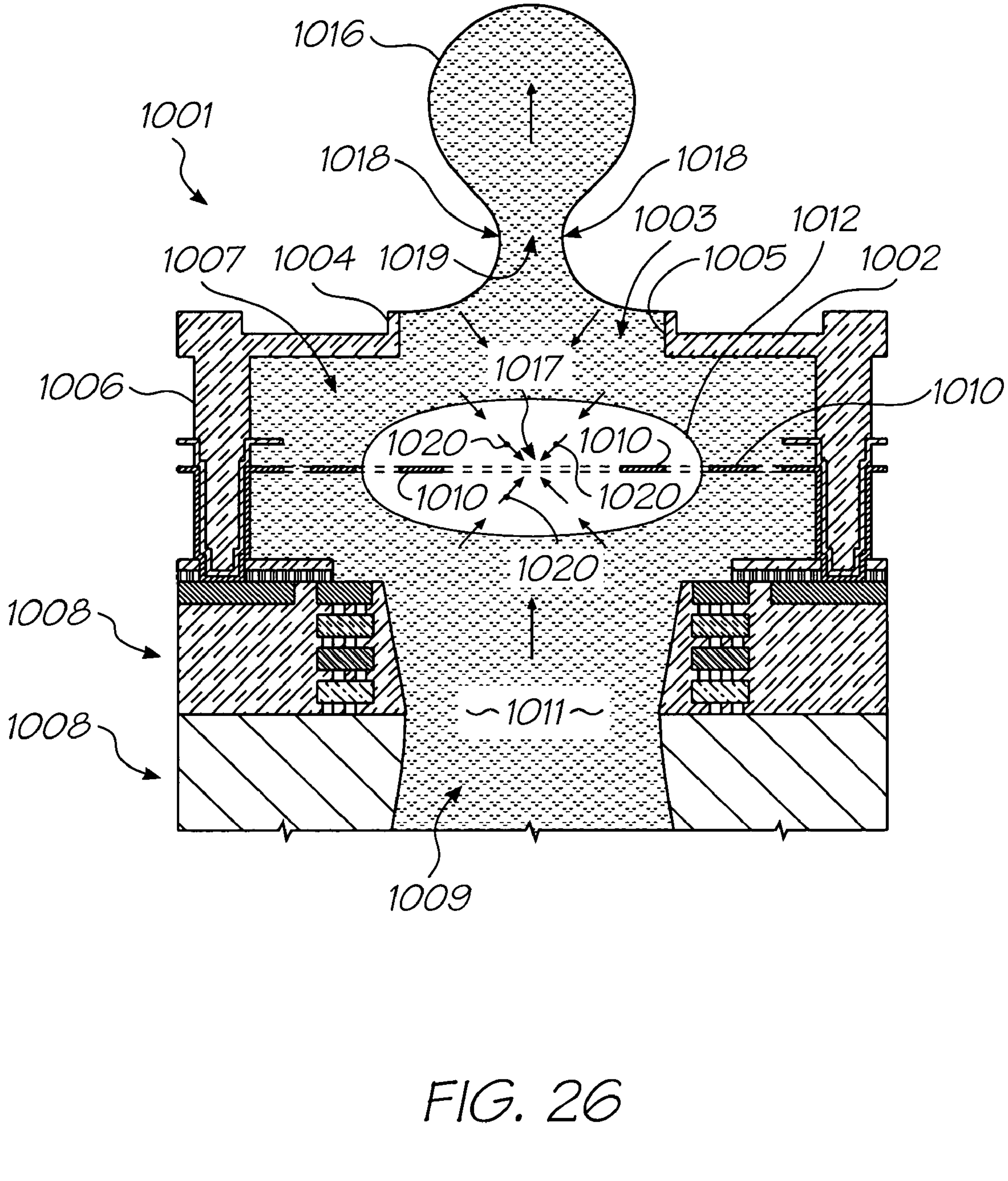
FIG. 26 shows a schematic cross-sectional view through an ink chamber of a single nozzle for injecting ink of a bubble forming heater element actuator type.

As shown in FIG. 26, the ink drop 1016 is being ejected is shown during its "necking phase" before the drop breaks off. At this stage, the bubble 1012 has already reached its maximum size and has then begun to collapse towards the point of collapse 1017.

The collapsing of the bubble 1012 towards the point of collapse 1017 causes some ink 1011 to be drawn from within the nozzle 1003 (from the sides 1018 of the drop), and some to be drawn from the inlet passage 1009, towards the point of collapse. Most of the ink 1011 drawn in this manner is drawn from the nozzle 1003, forming an annular neck 1019 at the base of the drop 1016 prior to its breaking off.

The drop 1016 requires a certain amount of momentum to overcome surface tension forces, in order to break off. As ink 1011 is drawn from the nozzle 1003 by the collapse of the bubble 1012, the diameter of the neck 1019 reduces thereby reducing the amount of total surface tension holding the drop, so that the momentum of the drop as it is ejected out of the nozzle is sufficient to allow the drop to break off.

When the drop 1016 breaks off, cavitation forces are caused as reflected by the arrows 1020, as the bubble 1012 collapses to the point of collapse 1017. It will be noted that there are no solid surfaces in the vicinity of the point of collapse 1017 on which the cavitation can have an effect.

Yet another type of printhead nozzle arrangement suitable for the printhead ICs will now be described with reference to FIGS. 27-29. This type typically provides an ink delivery nozzle arrangement having a nozzle chamber containing ink and a thermal bend actuator connected to a paddle positioned within the chamber. The thermal actuator device is actuated so as to eject ink from the nozzle chamber. The preferred embodiment includes a particular thermal bend actuator which includes a series of tapered portions for providing conductive heating of a conductive trace. The actuator is connected to the paddle via an arm received through a slotted wall of the nozzle chamber. The actuator arm has a mating shape so as to mate substantially with the surfaces of the slot in the nozzle chamber wall.

Figure 27A:
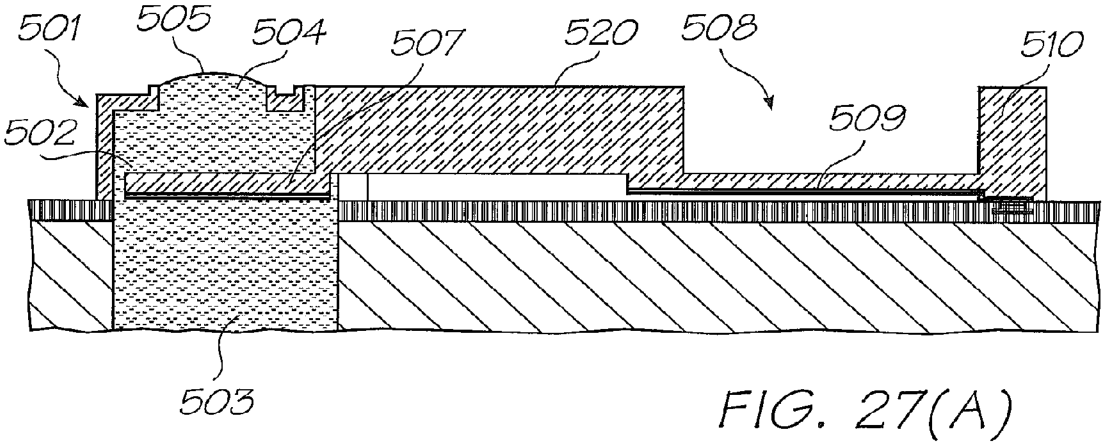
FIGS. 27A to 27C show the basic operational principles of a thermal bend actuator.
Figure 27B:
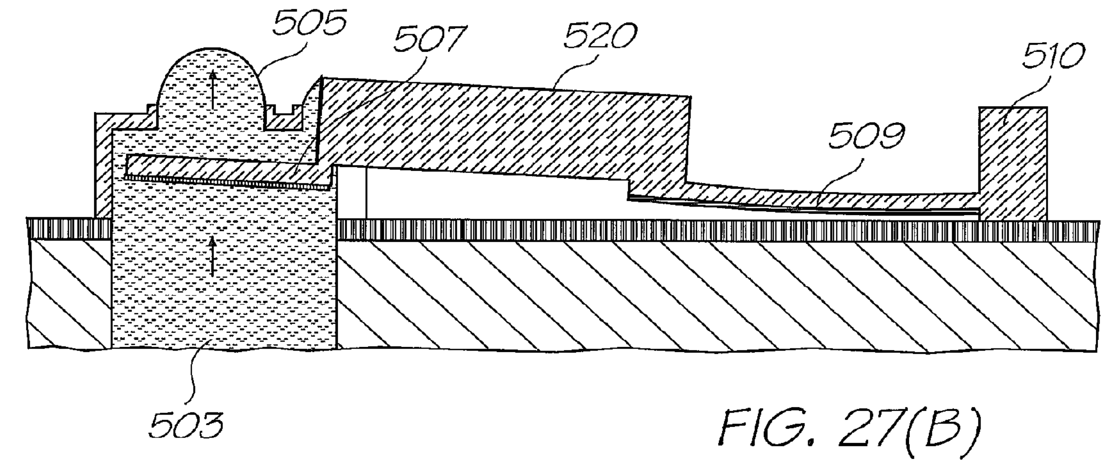
Figure 27C:
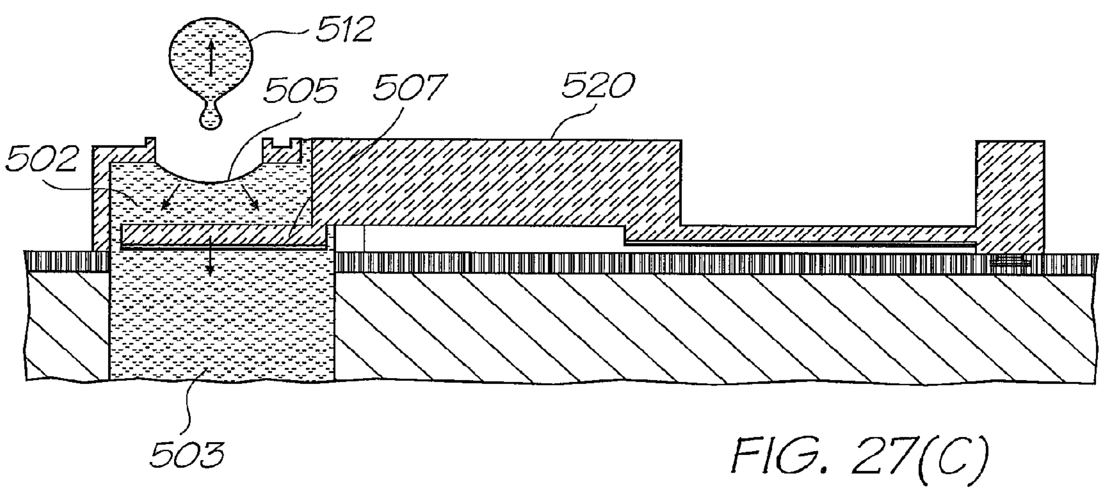

Turning initially to FIGS. 27(*a*)-(*c*), there is provided schematic illustrations of the basic operation of a nozzle arrangement of this embodiment. A nozzle chamber 501 is provided filled with ink 502 by means of an ink inlet channel 503 which can be etched through a wafer substrate on which the nozzle chamber 501 rests. The nozzle chamber 501 further includes an ink ejection port 504 around which an ink meniscus forms.

Inside the nozzle chamber 501 is a paddle type device 507 which is interconnected to an actuator 508 through a slot in the wall of the nozzle chamber 501. The actuator 508 includes a heater means e.g. 509 located adjacent to an end portion of a post 510. The post 510 is fixed to a substrate.

When it is desired to eject a drop from the nozzle chamber 501, as illustrated in FIG. 27(*b*), the heater means 509 is heated so as to undergo thermal expansion. Preferably, the heater means 509 itself or the other portions of the actuator 508 are built from materials having a high bend efficiency where the bend efficiency is defined as:

$$\text{bend efficiency} = \frac{\text{Young's Modulus} \times (\text{Coefficient of thermal Expansion})}{\text{Density} \times \text{Specific Heat Capacity}}$$

A suitable material for the heater elements is a copper nickel alloy which can be formed so as to bend a glass material.

The heater means 509 is ideally located adjacent the end portion of the post 510 such that the effects of activation are magnified at the paddle end 507 such that small thermal expansions near the post 510 result in large movements of the paddle end.

The heater means 509 and consequential paddle movement causes a general increase in pressure around the ink meniscus 505 which expands, as illustrated in FIG. 27(*b*), in a rapid manner. The heater current is pulsed and ink is ejected out of the port 504 in addition to flowing in from the ink channel 503.

Subsequently, the paddle 507 is deactivated to again return to its quiescent position. The deactivation causes a general reflow of the ink into the nozzle chamber. The forward momentum of the ink outside the nozzle rim and the corresponding backflow results in a general necking and breaking off of the drop 512 which proceeds to the print media. The collapsed meniscus 505 results in a general sucking of ink into the nozzle chamber 502 via the ink flow channel 503. In time, the nozzle chamber 501 is refilled such that the position in FIG. 27(*a*) is again reached and the nozzle chamber is subsequently ready for the ejection of another drop of ink.

Figure 28:
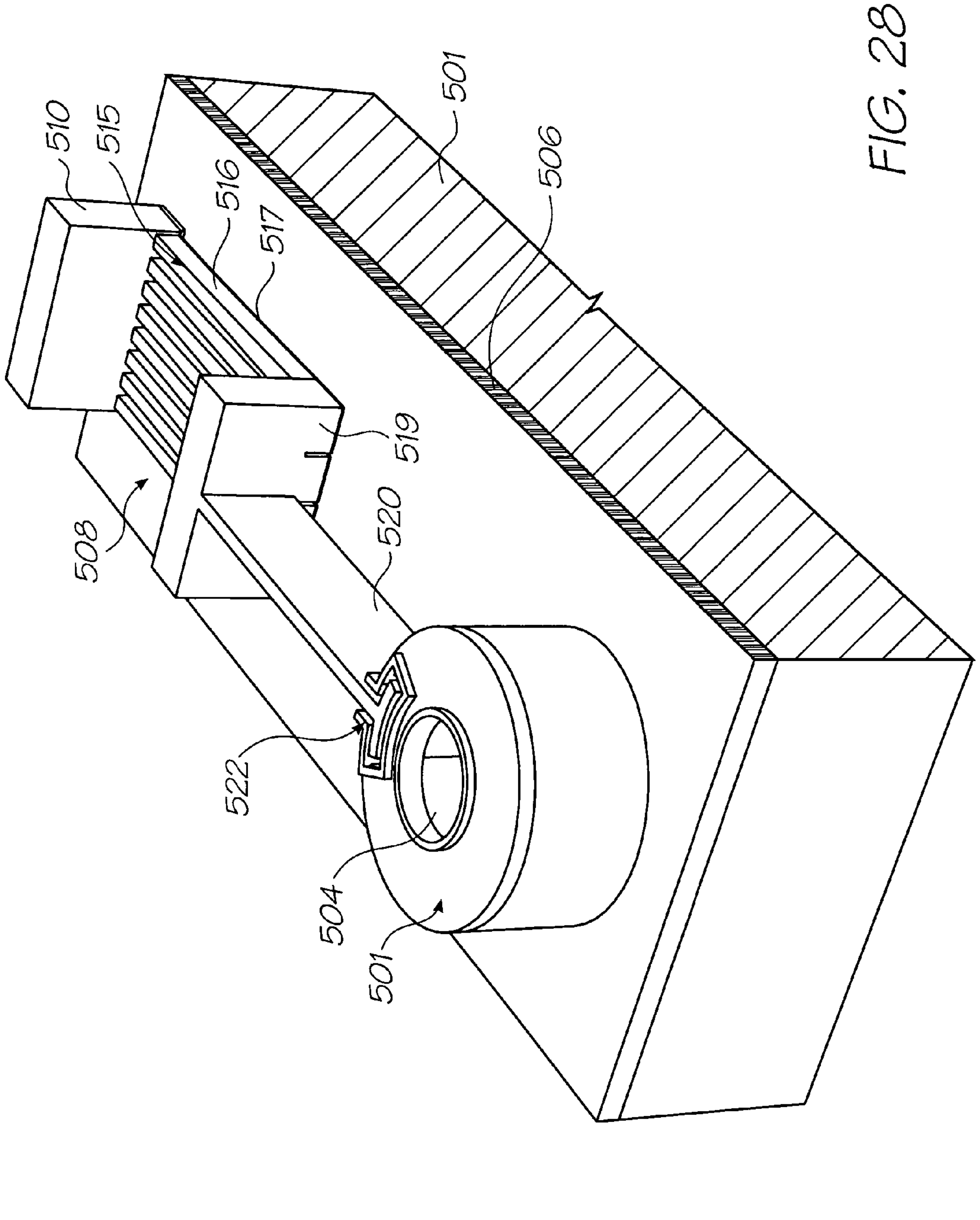
FIG. 28 shows a three dimensional view of a single ink jet nozzle arrangement constructed in accordance with FIG. 27.
Figure 29:
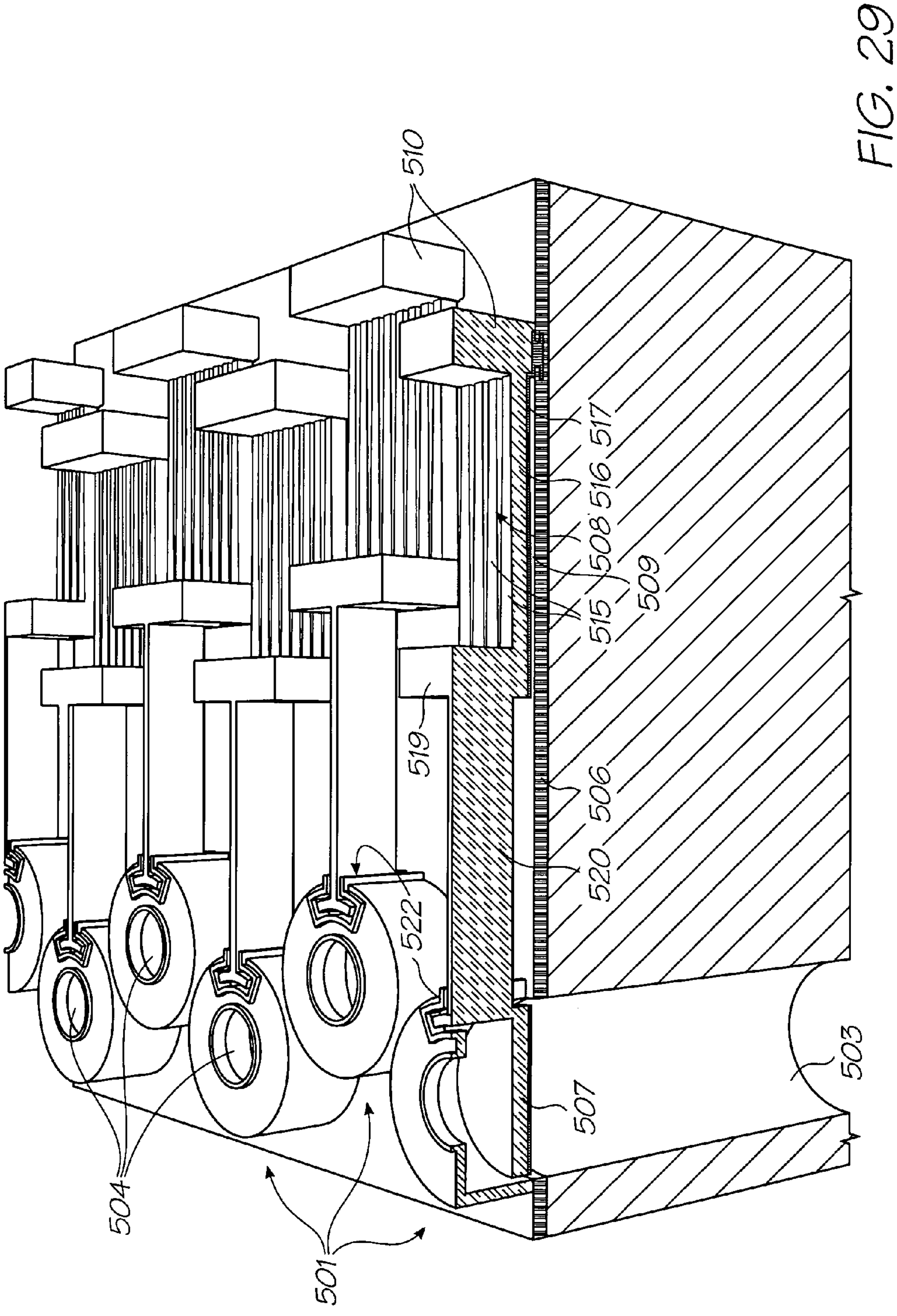
FIG. 29 shows an array of the nozzle arrangements shown in FIG. 28.

FIG. 28 illustrates a side perspective view of the nozzle arrangement. FIG. 29 illustrates sectional view through an array of nozzle arrangement of FIG. 28. In these figures, the numbering of elements previously introduced has been retained.

Firstly, the actuator 508 includes a series of tapered actuator units e.g. 515 which comprise an upper glass portion (amorphous silicon dioxide) 516 formed on top of a titanium nitride layer 517. Alternatively a copper nickel alloy layer (hereinafter called cupronickel) can be utilized which will have a higher bend efficiency.

The titanium nitride layer 517 is in a tapered form and, as such, resistive heating takes place near an end portion of the post 510. Adjacent titanium nitride/glass portions 515 are interconnected at a block portion 519 which also provides a mechanical structural support for the actuator 508.

The heater means 509 ideally includes a plurality of the tapered actuator unit 515 which are elongate and spaced apart such that, upon heating, the bending force exhibited along the axis of the actuator 508 is maximized. Slots are defined between adjacent tapered units 515 and allow for slight differential operation of each actuator 508 with respect to adjacent actuators 508.

The block portion 519 is interconnected to an arm 520. The arm 520 is in turn connected to the paddle 507 inside the nozzle chamber 501 by means of a slot e.g. 522 formed in the side of the nozzle chamber 501. The slot 522 is designed generally to mate with the surfaces of the arm 520 so as to minimize opportunities for the outflow of ink around the arm 520. The ink is held generally within the nozzle chamber 501 via surface tension effects around the slot 522.

When it is desired to actuate the arm 520, a conductive current is passed through the titanium nitride layer 517 within the block portion 519 connecting to a lower CMOS layer 506 which provides the necessary power and control circuitry for the nozzle arrangement. The conductive current results in heating of the nitride layer 517 adjacent to the post 510 which results in a general upward bending of the arm 20 and consequential ejection of ink out of the nozzle 504. The ejected drop is printed on a page in the usual manner for an inkjet printer as previously described.

An array of nozzle arrangements can be formed so as to create a single printhead. For example, in FIG. 29 there is illustrated a partly sectioned various array view which comprises multiple ink ejection nozzle arrangements laid out in interleaved lines so as to form a printhead array. Of course, different types of arrays can be formulated including full color arrays etc.

The construction of the printhead system described can proceed utilizing standard MEMS techniques through suitable modification of the steps as set out in U.S. Pat. No. 6,243,113 entitled "Image Creation Method and Apparatus (IJ 41)" to the present applicant, the contents of which are fully incorporated by cross reference.

The integrated circuits 74 may be arranged to have between 5000 to 100,000 of the above described ink delivery nozzles arranged along its surface, depending upon the length of the integrated circuits and the desired printing properties required. For example, for narrow media it may be possible to only require 5000 nozzles arranged along the surface of the printhead assembly to achieve a desired printing result, whereas for wider media a minimum of 10,000, 20,000 or 50,000 nozzles may need to be provided along the length of the printhead assembly to achieve the desired printing result. For full colour photo quality images on A4 or US letter sized media at or around 1600 dpi, the integrated circuits 74 may have 13824 nozzles per color. Therefore, in the case where the printhead assembly 22 is capable of printing in 4 colours (C, M, Y, K), the integrated circuits 74 may have around 53396 nozzles disposed along the surface thereof. Further, in a case where the printhead assembly 22 is capable of printing 6 printing fluids (C, M, Y, K, IR and a fixative) this may result in 82944 nozzles being provided on the surface of the integrated circuits 74. In all such arrangements, the electronics supporting each nozzle is the same.

While the present invention has been illustrated and described with reference to exemplary embodiments thereof, various modifications will be apparent to and might readily be made by those skilled in the art without departing from the scope and spirit of the present invention. Accordingly, it is not intended that the scope of the claims appended hereto be limited to the description as set forth herein, but, rather, that the claims be broadly construed.

The invention claimed is:

1. A bonded assembly comprising:

(a) a printhead integrated circuit having a plurality of ink supply channel inlets and a plurality of etched trenches defined in a first bonding surface thereof, and (b) a molded polymer ink manifold having a second bonding surface, the second bonding surface being bonded to the first bonding surface with an adhesive tape comprising a liquid-based adhesive, wherein the adhesive tape has a plurality of laser-drilled holes defined therein to coincide with the ink supply channel inlets defined in said first bonding surface, said holes and said ink supply channel inlets having substantially the same width, and wherein the adhesive is received, at least partially, in the plurality of etched trenches.

2. The bonded assembly of claim 1, wherein the printhead integrated circuit has a thickness of less than 1000 microns.

3. The bonded assembly of claim 1, wherein the printhead integrated circuit has a thickness of less than 250 microns.

4. The bonded assembly of claim 1, wherein the printhead integrated circuit is a semiconductor integrated circuit.

5. The bonded assembly of claim 1, wherein the printhead integrated circuit is a MEMS integrated circuit.

6. The bonded assembly of claim 1, wherein the ink manifold has a plurality of printhead integrated circuits mounted thereon.

7. The bonded assembly of claim 1, wherein the etched trenches have a diameter or a width sufficient to draw in a liquid adhesive by capillary action.

8. The bonded assembly of claim 1, wherein the etched trenches have a diameter or a width of less than about 10 microns.

9. The bonded assembly of claim 1, wherein the etched trenches have a depth of at least 20 microns.

10. The bonded assembly of claim 1, wherein the etched trenches have an aspect ratio of at least 3.1.

11. The bonded assembly of claim 1, wherein the etched trenches increase the effective surface area of the first bonding surface by at least 20%.

12. The bonded assembly of claim 1, wherein the first bonding surface has a maximum surface roughness $R_{max}$ of less than about 20 nm.

13. The bonded assembly of claim 1, wherein the first bonding surface has a maximum surface roughness $R_{max}$ of less than about 5 nm.

14. The bonded assembly of claim 1, wherein the first bonding surface has an average surface roughness $R_a$ of less than about 20 nm.

15. The bonded assembly of claim 1, wherein the first bonding surface has an average surface roughness $R_a$ of less than about 5 nm.

16. The bonded assembly of claim 1, wherein the first substrate has a Total Thickness Variation (TTV) of less than about 5 microns.

* * * * *